(12) United States Patent
Casper et al.

(10) Patent No.: US 6,791,885 B2
(45) Date of Patent: Sep. 14, 2004

(54) PROGRAMMABLE CONDUCTOR RANDOM ACCESS MEMORY AND METHOD FOR SENSING SAME

(75) Inventors: Stephen L. Casper, Boise, ID (US); Kevin Duesman, Boise, ID (US); Glen Hush, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/076,486

(22) Filed: Feb. 19, 2002

(65) Prior Publication Data

US 2003/0156463 A1 Aug. 21, 2003

(51) Int. Cl.[7] .................................................. G11C 7/00
(52) U.S. Cl. .................................. 365/189.07; 365/203
(58) Field of Search ........................... 365/189.07, 203, 365/202

(56) References Cited

U.S. PATENT DOCUMENTS

| | | |
|---|---|---|
| 3,271,591 A | 9/1966 | Ovshinsky ................... 327/500 |
| 3,622,319 A | 11/1971 | Sharp .......................... 430/396 |
| 3,743,847 A | 7/1973 | Boland ...................... 250/505.1 |
| 3,961,314 A | 6/1976 | Klose et al. ................. 365/113 |
| 3,966,317 A | 6/1976 | Wacks et al. .................. 355/19 |
| 3,983,542 A | 9/1976 | Ovshinsky ................... 365/113 |
| 3,988,720 A | 10/1976 | Ovshinsky ................... 365/113 |
| 4,112,512 A | 9/1978 | Arzubi et al. ................ 365/149 |
| 4,177,474 A | 12/1979 | Ovshinsky ..................... 252/62 |
| 4,267,261 A | 5/1981 | Hallman et al. ............. 430/322 |
| 4,269,935 A | 5/1981 | Masters et al. .............. 430/323 |
| 4,312,938 A | 1/1982 | Drexler et al. .............. 430/496 |
| 4,316,946 A | 2/1982 | Masters et al. ................. 430/9 |
| 4,320,191 A | 3/1982 | Yoshikawa et al. .......... 430/296 |
| 4,405,710 A | 9/1983 | Balasubramanyam et al. .......................... 430/311 |
| 4,419,421 A | 12/1983 | Wichelhaus et al. ......... 429/323 |
| 4,499,557 A | 2/1985 | Holmberg et al. ........... 365/163 |
| 4,597,162 A | 7/1986 | Johnson et al. ................ 438/16 |

(List continued on next page.)

FOREIGN PATENT DOCUMENTS

| | | |
|---|---|---|
| JP | 56126916 | 10/1981 |
| WO | WO 97/48032 | 12/1997 |
| WO | WO 99/28914 | 6/1999 |
| WO | WO 00/48196 | 8/2000 |
| WO | WO 02/21542 | 3/2002 |

OTHER PUBLICATIONS

Axon Technologies Corporation, Technology Description: *Programmable Metalization Cell(PMC)*, pp. 1–6 (Pre–May 2000).

Helbert et al, *Intralevel hybrid resist process with submicron capability* SPIE vol. 333 Submicron Lithography, pp. 24–29 (1982).

Hilt, Dissertation: *Materials characterization of Silver Chalcogenide Programmable Metalization Cells*, Arizona State University, pp. Title p.–114 (UMI Company, May 1999).

(List continued on next page.)

*Primary Examiner*—M. Tran
(74) *Attorney, Agent, or Firm*—Dickstein Shapiro Morin & Oshinsky LLP

(57) ABSTRACT

A sense circuit for reading a resistance level of a programmable conductor random access memory (PCRAM) cell is provided. A voltage potential difference is introduced across a PCRAM cell by activating an access transistor from a raised rowline voltage. Both a digit line and a digit complement reference line are precharged to a first predetermined voltage. The cell being sensed has the precharged voltage discharged through the resistance of the programmable conductor memory element of the PCRAM cell. A comparison is made of the voltage read at the digit line and at the reference conductor. If the voltage at the digit line is greater than the reference voltage, the cell is read as a high resistance value (e.g., logic HIGH); however, if the voltage measured at the digit line is lower than that of the reference voltage, the cell is read as a low resistance value (e.g., logic LOW).

57 Claims, 7 Drawing Sheets

U.S. PATENT DOCUMENTS

| | | | |
|---|---|---|---|
| 4,608,296 A | 8/1986 | Keem et al. | 428/215 |
| 4,637,895 A | 1/1987 | Ovshinsky et al. | 252/372 |
| 4,646,266 A | 2/1987 | Ovshinsky et al. | 365/105 |
| 4,664,939 A | 5/1987 | Ovshinsky | 438/62 |
| 4,668,968 A | 5/1987 | Ovshinsky et al. | 257/61 |
| 4,670,763 A | 6/1987 | Ovshinsky et al. | 257/57 |
| 4,671,618 A | 6/1987 | Wu et al. | 349/92 |
| 4,673,957 A | 6/1987 | Ovshinsky et al. | 257/58 |
| 4,678,679 A | 7/1987 | Ovshinsky | 427/562 |
| 4,696,758 A | 9/1987 | Ovshinsky et al. | 252/501.1 |
| 4,698,234 A | 10/1987 | Ovshinsky et al. | 438/62 |
| 4,710,899 A | 12/1987 | Young et al. | 365/113 |
| 4,728,406 A | 3/1988 | Banerjee et al. | 204/192.29 |
| 4,737,379 A | 4/1988 | Hudgens et al. | 427/575 |
| 4,766,471 A | 8/1988 | Ovshinsky et al. | 257/53 |
| 4,769,338 A | 9/1988 | Ovshinsky et al. | 438/151 |
| 4,775,425 A | 10/1988 | Guha et al. | 136/249 |
| 4,788,594 A | 11/1988 | Ovshinsky et al. | 348/64 |
| 4,795,657 A | 1/1989 | Formigoni et al. | 427/96 |
| 4,800,526 A | 1/1989 | Lewis | 365/118 |
| 4,809,044 A | 2/1989 | Pryor et al. | 257/3 |
| 4,818,717 A | 4/1989 | Johnson et al. | 438/130 |
| 4,843,443 A | 6/1989 | Ovshinsky et al. | 257/59 |
| 4,845,533 A | 7/1989 | Pryor et al. | 257/4 |
| 4,847,674 A | 7/1989 | Sliwa et al. | 257/767 |
| 4,853,785 A | 8/1989 | Ovshinsky et al. | 348/302 |
| 4,891,330 A | 1/1990 | Guha et al. | 438/488 |
| 5,128,099 A | 7/1992 | Strand et al. | 420/579 |
| 5,159,661 A | 10/1992 | Ovshinsky et al. | 706/33 |
| 5,166,758 A | 11/1992 | Ovshinsky et al. | 257/3 |
| 5,177,567 A | 1/1993 | Klersy et al. | 257/4 |
| 5,219,788 A | 6/1993 | Abernathey et al. | 438/636 |
| 5,238,862 A | 8/1993 | Blalock et al. | 438/398 |
| 5,272,359 A | 12/1993 | Nagasubramanian et al. | 257/40 |
| 5,296,716 A | 3/1994 | Ovshinsky et al. | 257/3 |
| 5,314,772 A | 5/1994 | Kozicki | |
| 5,315,131 A | 5/1994 | Kishimoto et al. | 257/57 |
| 5,335,219 A | 8/1994 | Ovshinsky et al. | 369/288 |
| 5,341,328 A | 8/1994 | Ovshinsky et al. | 265/113 |
| 5,350,484 A | 9/1994 | Gardner et al. | 438/669 |
| 5,359,205 A | 10/1994 | Ovshinsky | 257/3 |
| 5,360,981 A | 11/1994 | Owen et al. | 257/4 |
| 5,406,509 A | 4/1995 | Ovshinsky et al. | 365/113 |
| 5,414,271 A | 5/1995 | Ovshinsky et al. | 257/3 |
| 5,500,532 A | 3/1996 | Kozicki et al. | 250/372 |
| 5,512,328 A | 4/1996 | Yoshimura et al. | 427/498 |
| 5,512,773 A | 4/1996 | Wolf et al. | 257/471 |
| 5,534,711 A | 7/1996 | Ovshinsky et al. | 257/3 |
| 5,534,712 A | 7/1996 | Ovshinsky et al. | 257/3 |
| 5,536,947 A | 7/1996 | Klersy et al. | 257/3 |
| 5,543,737 A | 8/1996 | Ovshinsky | 326/104 |
| 5,591,501 A | 1/1997 | Ovshinsky et al. | 428/64.1 |
| 5,596,522 A | 1/1997 | Ovshinsky et al. | 365/113 |
| 5,687,112 A | 11/1997 | Ovshinsky | 365/163 |
| 5,694,054 A | 12/1997 | Ovshinsky et al. | 326/35 |
| 5,714,768 A | 2/1998 | Ovshinsky et al. | 257/40 |
| 5,726,083 A | 3/1998 | Takaishi | 438/210 |
| 5,751,012 A | 5/1998 | Wolstenholme et al. | 257/5 |
| 5,761,115 A | 6/1998 | Kozicki et al. | 365/182 |
| 5,789,277 A | 8/1998 | Zahorik et al. | 438/95 |
| 5,814,527 A | 9/1998 | Wolstenholme et al. | |
| 5,818,749 A | 10/1998 | Harshfield | |
| 5,825,046 A | 10/1998 | Czubatyj et al. | 257/2 |
| 5,841,150 A | 11/1998 | Gonzalez et al. | 257/3 |
| 5,846,889 A | 12/1998 | Harbison et al. | 501/40 |
| 5,851,882 A | 12/1998 | Harshfield | |
| 5,869,843 A | 2/1999 | Harshfield | |
| 5,883,827 A | 3/1999 | Morgan | 365/100 |
| 5,896,312 A | 4/1999 | Kozicki et al. | 365/153 |
| 5,912,839 A | 6/1999 | Ovshinsky et al. | 365/185.03 |
| 5,914,893 A | 6/1999 | Kozicki et al. | 365/107 |
| 5,920,788 A | 7/1999 | Reinberg | 438/466 |
| 5,933,365 A | 8/1999 | Klersy et al. | 365/148 |
| 5,998,066 A | 12/1999 | Block et al. | 430/5 |
| 6,011,757 A | 1/2000 | Ovshinsky | 369/13.35 |
| 6,031,287 A | 2/2000 | Harshfield | |
| 6,072,716 A | 6/2000 | Jacobson et al. | 365/163 |
| 6,077,729 A | 6/2000 | Harshfield | 438/128 |
| 6,084,796 A | 7/2000 | Kozicki et al. | 365/153 |
| 6,087,674 A | 7/2000 | Ovshinsky et al. | 257/2 |
| 6,117,720 A | 9/2000 | Harshfield | 438/238 |
| 6,141,241 A | 10/2000 | Ovshinsky et al. | 365/163 |
| 6,143,604 A | 11/2000 | Chiang et al. | 438/253 |
| 6,151,244 A * | 11/2000 | Fujino et al. | 365/149 |
| 6,177,338 B1 | 1/2001 | Liaw et al. | 438/629 |
| 6,236,059 B1 | 5/2001 | Wolstenholme et al. | 257/3 |
| RE37,259 E | 7/2001 | Ovshinsky | |
| 6,297,170 B1 | 10/2001 | Gabriel et al. | 438/738 |
| 6,300,684 B1 | 10/2001 | Gonzalez et al. | 257/774 |
| 6,314,014 B1 | 11/2001 | Lowrey et al. | 365/100 |
| 6,316,784 B1 | 11/2001 | Zahorik et al. | 257/3 |
| 6,329,606 B1 | 12/2001 | Freyman et al. | 174/260 |
| 6,335,896 B1 * | 1/2002 | Wahlstrom | 365/230.03 |
| 6,339,544 B1 | 1/2002 | Chiang et al. | 365/163 |
| 6,348,365 B1 | 2/2002 | Moore et al. | 438/130 |
| 6,350,679 B1 | 2/2002 | McDaniel et al. | 438/634 |
| 6,359,805 B1 * | 3/2002 | Hidaka | 365/171 |
| 6,376,284 B1 | 4/2002 | Gonzalez et al. | 438/129 |
| 6,388,324 B2 | 5/2002 | Kozicki et al. | 257/75 C |
| 6,391,688 B1 | 5/2002 | Gonzalez et al. | 438/128 |
| 6,404,665 B1 | 6/2002 | Lowrey et al. | 365/100 |
| 6,414,376 B1 | 7/2002 | Thakur et al. | 257/640 |
| 6,418,049 B1 | 7/2002 | Kozicki et al. | 365/174 |
| 6,420,725 B1 | 7/2002 | Harshfield | |
| 6,423,628 B1 | 7/2002 | Li et al. | 438/622 |
| 6,429,064 B1 | 8/2002 | Wicker | 438/238 |
| 6,437,383 B1 | 8/2002 | Xu | 257/300 |
| 6,440,837 B1 | 8/2002 | Harshfield | |
| 6,449,203 B1 * | 9/2002 | Cowles et al. | 365/222 |
| 6,462,984 B1 | 10/2002 | Xu et al. | 365/175 |
| 6,469,364 B1 | 10/2002 | Kozicki | 257/529 |
| 6,473,332 B1 | 10/2002 | Ignatiev et al. | |
| 6,480,438 B1 | 11/2002 | Park | 365/230.06 |
| 6,487,106 B1 | 11/2002 | Kozicki | 365/153 |
| 6,487,113 B1 | 11/2002 | Park et al. | 365/163 |
| 6,501,111 B1 | 12/2002 | Lowrey | 257/295 |
| 6,507,061 B1 | 1/2003 | Hudgens et al. | 257/4 |
| 6,511,862 B2 | 1/2003 | Hudgens et al. | 438/95 |
| 6,511,867 B2 | 1/2003 | Lowrey et al. | 438/128 |
| 6,512,241 B1 | 1/2003 | Lai | 257/4 |
| 6,514,805 B2 | 2/2003 | Xu et al. | 438/164 |
| 6,531,373 B2 | 3/2003 | Gill et al. | 438/400 |
| 6,534,781 B2 | 3/2003 | Dennison | 257/5 |
| 6,545,287 B2 | 4/2003 | Chiang | 257/3 |
| 6,545,907 B1 | 4/2003 | Lowrey et al. | 365/163 |
| 6,555,860 B2 | 4/2003 | Lowrey et al. | 257/296 |
| 6,563,164 B2 | 5/2003 | Lowrey et al. | 257/314 |
| 6,566,700 B2 | 5/2003 | Xu | 257/296 |
| 6,567,293 B1 | 5/2003 | Lowrey et al. | 365/100 |
| 6,569,705 B2 | 5/2003 | Chiang et al. | 438/95 |
| 6,570,784 B2 | 5/2003 | Lowrey | 365/163 |
| 6,576,921 B2 | 6/2003 | Lowrey | 257/42 |
| 6,586,761 B2 | 7/2003 | Lowrey | 257/3 |
| 6,589,714 B2 | 7/2003 | Maimon et al. | 430/313 |
| 6,590,807 B2 | 7/2003 | Lowrey | 365/175 |
| 6,593,176 B2 | 7/2003 | Dennison | 438/200 |
| 6,597,009 B2 | 7/2003 | Wicker | 257/4 |
| 6,605,527 B2 | 8/2003 | Dennison et al. | 438/618 |
| 6,613,604 B2 | 9/2003 | Maimon et al. | 438/95 |
| 6,621,095 B2 | 9/2003 | Chiang et al. | 257/5 |
| 6,625,054 B2 | 9/2003 | Lowrey et al. | 365/148 |

| | | |
|---|---|---|
| 6,642,102 B2 | 11/2003 | Xu .............................. 438/257 |
| 6,646,297 B2 | 11/2003 | Dennison .................... 257/296 |
| 6,649,928 B2 | 11/2003 | Dennison ........................ 257/4 |
| 6,667,900 B2 | 12/2003 | Lowrey et al. ............. 365/171 |
| 6,671,710 B2 | 12/2003 | Ovshinsky et al. ......... 708/493 |
| 6,673,700 B2 | 1/2004 | Dennison et al. ............ 438/466 |
| 6,674,115 B2 | 1/2004 | Hudgens et al. ............ 257/310 |
| 6,687,153 B2 | 2/2004 | Lowrey ....................... 438/597 |
| 6,687,427 B2 | 2/2004 | Ramalingam et al. ...... 365/163 |
| 6,690,026 B2 | 2/2004 | Peterson ...................... 385/16 |
| 6,696,355 B2 | 2/2004 | Dennison ........................ 257/4 |
| 6,707,712 B2 | 3/2004 | Lowery ....................... 365/175 |
| 6,714,954 B2 | 3/2004 | Ovshinsky et al. ......... 708/200 |
| 2002/0000666 A1 | 1/2002 | Kozicki et al. ............. 250/372 |
| 2002/0072188 A1 | 6/2002 | Gilton |
| 2002/0106849 A1 | 8/2002 | Moore |
| 2002/0123169 A1 | 9/2002 | Moore et al. |
| 2002/0123170 A1 | 9/2002 | Moore et al. |
| 2002/0123248 A1 | 9/2002 | Moore et al. |
| 2002/0127886 A1 | 9/2002 | Moore et al. |
| 2002/0132417 A1 | 9/2002 | Li |
| 2002/0160551 A1 | 10/2002 | Harshfield |
| 2002/0163828 A1 | 11/2002 | Krieger et al. |
| 2002/0168820 A1 | 11/2002 | Kozicki |
| 2002/0168852 A1 | 11/2002 | Harshfield et al. |
| 2002/0190289 A1 | 12/2002 | Harshfield et al. |
| 2002/0190350 A1 | 12/2002 | Kozicki |
| 2003/0001229 A1 | 1/2003 | Moore et al. |
| 2003/0027416 A1 | 2/2003 | Moore |
| 2003/0032254 A1 | 2/2003 | Gilton |
| 2003/0035314 A1 | 2/2003 | Kozicki |
| 2003/0035315 A1 | 2/2003 | Kozicki |
| 2003/0038301 A1 | 2/2003 | Moore |
| 2003/0043631 A1 | 3/2003 | Gilton et al. |
| 2003/0045049 A1 | 3/2003 | Campbell et al. |
| 2003/0045054 A1 | 3/2003 | Campbell et al. |
| 2003/0047765 A1 | 3/2003 | Campbell |
| 2003/0047772 A1 | 3/2003 | Li |
| 2003/0047773 A1 | 3/2003 | Li |
| 2003/0048519 A1 | 3/2003 | Kozicki |
| 2003/0048744 A1 | 3/2003 | Ovshinsky et al. |
| 2003/0049912 A1 | 3/2003 | Campbell et al. |
| 2003/0068861 A1 | 4/2003 | Li et al. |
| 2003/0068862 A1 | 4/2003 | Li et al. |
| 2003/0095426 A1 | 5/2003 | Hush et al. |
| 2003/0096497 A1 | 5/2003 | Moore et al. |
| 2003/0107105 A1 | 6/2003 | Kozicki |
| 2003/0117831 A1 | 6/2003 | Hush |
| 2003/0128612 A1 | 7/2003 | Moore et al. |
| 2003/0137869 A1 | 7/2003 | Kozicki |
| 2003/0143782 A1 | 7/2003 | Gilton et al. |
| 2003/0156447 A1 | 8/2003 | Kozicki |
| 2003/0156463 A1 | 8/2003 | Casper et al. |
| 2003/0212724 A1 | 11/2003 | Ovshinsky et al. |
| 2003/0212725 A1 | 11/2003 | Ovshinsky et al. |
| 2004/0035401 A1 | 2/2004 | Ramachandran et al. |

OTHER PUBLICATIONS

Hirose et al., *High Speed Memory Behavior and Reliability of an Amorphous $As_2S_3$ Film Doped Ag*, Phys. Stat. Sol. (a) 61, pp. 87–90 (1980).

Holmquist et al., *Reaction and Diffusion in Silver–Arsenic Chalcogenide Glass Systems*, 62 J. Amer. Ceram. Soc., No. 3–4, pp. 183–188 (Mar.–Apr. 1979).

Huggett et al., *Development of silver sensitized germanium selenide photoresist by reactive sputter etching in $SF_6$*, 42 Appl. Phys. Lett., No. 7, pp. 592–594 (Apr. 1983).

Kawaguchi et al , *Mechanism of photosurface deposition*, 164–166 J. Non–Cryst. Solids, pp. 1231–1234 (1993).

Kolobov and Elliott, Photodoping of Amorphous Chalcogenides by Metals, Advances in Physics, vol. 40. No. 5. 625–684 (1991).

Kozicki et al., "Applications of Programmable Resistance Changes in Metal–doped Chalcogenides", Proceedings of the 1999 Symposium on Solid State Ionic Devices, Editors—E.D. Wachsman et al., The Electrochemical Society, Inc. 1–12 (1999).

Kozicki, et al., *Nanoscale effects in devices based on chalcogenide solid solutions*. Superlattices and Microstructures, 27, 485–488 (2000).

Kozicki, et al., *Nanoscale phase separation in Ag–Ge–Se glasses*, Microelectronic Engineering, vol. 63/1–3, 155–159 (2002).

M.N. Kozicki and M. Mitkova, *Silver incorporation in thin films of selenium rich Ge–Se glasses*, Proceedings of the XIX International Congress on Glass, Society for Glass Technology, 226–227 (2001).

McHardy et al., *The dissolution of metals in amorphous chalcogenides and the effects o electron and ultraviolet radiation*, 20 J. Phys. C.: Solid State Phys., pp. 4055–4075 (1987)f.

Owen et al., *Metal–Chalcogenide Photoresists for High Resolution Lithography and Sub–Micron Structures*, Nanostructure Physics and Fabrication, pp. 447–451 (M. Reed ed. 1989).

Shimizu et al., *The Photo–Erasable Memory Switching Effect of Ag Photo–Doped Chalcogenide Glasses*, 46 B. Chem Soc. Japan, No. 12, pp. 3662–3365 (1973).

Michael N. Kozicki, *1. Programmable Metallization Cell Technology Description*, Feb. 18, 2000.

Michael N. Kozicki, Axon Technologies Corp. and Arizona State University, Presentation to Micron Technology, Inc., Apr. 6, 2000.

Abdel–All, A.; Elshafie,A.; Elhawary, M.M., DC electric–field effect in bulk and thin–film Ge5As38Te57 chalcogenide glass, Vacuum 59 (2000) 845–853.

Adler, D.; Moss, S.C., Amorphous memories and bistable switches, J. Vac. Sci. Technol. 9 (1972) 1182–1189.

Adler, D.; Henisch, H.K.; Mott, S.N., The mechanism of threshold switching in amorphous alloys, Rev. Mod. Phys. 50 (1978) 209–220.

Afifi, M.A.; Labib, H.H.; El–Fazary, M.H.; Fadel, M., Electrical and thermal properties of chalcogenide glass system Se75Ge25–xSbx, Appl. Phys. A 55 (1992) 167–169.

Afifi,M.A.; Labib, H.H.; Fouad, S.S.; El–Shazly, A.A., Electrical & thermal conductivity of the amorphous semiconductor GexSe1–x, Egypt, J. Phys. 17 (1986) 335–342.

Alekperova, Sh.M.; Gadzhieva, G.S., Current–Voltage characteristics of Ag2Se single crystal near the phase transition, Inorganic Materials 23 (1987) 137–139.

Aleksiejunas, A.; Cesnys, A., Switching phenomenon and memory effect in thin–film heterojunction of polycrystalline selenium–silver selenide, Phys. Stat. Sol. (a) 19 (1973) K169–K171.

Angell, C.A., Mobile ions in amorphous solids, Annu. Rev. Phys. Chem. 43 (1992) 693–717.

Aniya, M., Average electronegativity, medium–range–order, and ionic conductivity in superionic glasses, Solid state Ionics 136–137 (2000) 1085–1089.

Asahara, Y.; Izumitani, T., Voltage controlled switching in Cu–As–Se compositions, J. Non–Cryst. Solids 11 (1972) 97–104.

Asokan, S.; Prasad, M.V.N.; Parthasarathy, G.: Gopal, E.S.R., Mechanical and chemical thresholds in IV–VI chalcogenide glasses, Phys. Rev. Lett. 62 (1989) 808–810.

Baranovskii, S.D.; Cordes, H., On the conduction mechanism ionic glasses, J. Chem. Phys. 111 (1999) 7546–7557.

Belin, R.; Taillades, G.; Pradel, A.; Ribes, M., Ion dynamics in superionic chalcogenide glasses: complete conductivity spectra, Solid state Ionics 136–137 (2000) 1025–1029.

Belin, R.; Zerouale, A.; Pradel, A.; Ribes, M., Ion dynamics in the argyrodite compound Ag7GeSe5I: non–Arrhenius behavior and complete conductivity spectra, Solid State Ionics 143 (2001) 445–455.

Benmore, C.J.; Salmon, P.S., Structure of fast ion conducting and semiconducting glassy chalcogenide alloys, Phys. Rev. Lett. 73 (1994) 264–267.

Bernede, J.C., Influence du metal des electrodes sur les caracteristiques courant–tension des structures M–Ag2Se–M. Thin solid films 70 (1980) L1–L4.

Bernede, J.C., Polarized memory switching in MIS thin films, Thin Solid Films 81 (1981) 155–160.

Bernede, J.C., Switching and silver movements in Ag2Se thin films, Phys. Stat. Sol. (a) 57 (1980) K101–K104.

Bernede, J.C.; Abachi, T., Differential negative resistance in metal/insulator/metal structures with an upper bilayer electrode, Thin solid films 131 (1985) L61–L64.

Bernede, J.C.; Conan, A.; Fousenan't, E.; El Bouchairi, B.; Goureaux, G., Polarized memory switching effects in Ag2Se/Se/M thin film sandwiches, Thin solid films 97 (1982) 165–171.

Bernede, J.C.; Khelil, A.; Kettaf, M.; Conan, A., Transition from S– to N–type differential negative resistance in Al–Al2O3–Ag2–xSe1+x thin film structures. Phys. Stat. Sol. (a) 74 (1982) 217–224.

Bondarev, V.N.; Pikhitsa, P.V., A dendrite model of current instability in RbAg4I5, Solid State Ionics 70/71 (1994) 72–76.

Boolchand, P., The maximum in glass transition temperatur (Tg) near x=1/3 in GexSe1–x Glasses, Asian Journal of Physics (2000) 9, 709–72.

Boolchand, P.; Bresser, W.J., Mobile silver ions and glass formation in solid electrolytes, Nature 410 (2001) 1070–1073.

Boolchand, P.; Georgiev, D.G.; Goodman, B., Discovery of the Intermediate Phase in Chalcogenide Glasses, J. Optoelectronics and Advanced Materials, 3 (2001), 703.

Boolchand, P.; Selvanathan, D.; Wang, Y.; Georgiev, D.G.; Bresser, W.J., Onset of rigidity in steps in chalcogenide glasses, Properties and Applications of Amorphous Materials, M.F. Thorpe and Tichy, L. (eds.) Kluwer Academic Publishers, the Netherlands, 2001, pp. 97–132.

Boolchand, P.; Enzweiler, R.N.; Tenhover, M., Structural ordering of evaporated amorphous chalcogenide alloy films: role of thermal annealing, Diffusion and Defect Data vol. 53–54 (1987) 415–420.

Boolchand, P.; Grothaus, J.; Bresser, W.J.; Suranyi, P., Structural origin of broken chemical order in a GeSe2 glass, Phys. Rev. B 25 (1982) 2975–2978.

Boolchand, P.; Grothaus, J.; Phillips, J.C., Broken chemical order and phase separation in GexSe1–x glasses, Solid state comm. 45 (1983) 183–185.

Boolchand, P., Bresser, W.J., Compositional trends in glass transition temperature (Tg), network connectivity and nanoscale chemical phase separation in chalcogenides, Dept. of ECECS, Univ. Cincinnati (Oct. 28, 1999) 45221–0030.

Boolchand, P.; Grothaus, J. Molecular Structure of Melt–Quenched GeSe2 and GeS2 glasses compared, Proc. Int. Conf. Phys. Semicond. (Eds. Chadi and Harrison) $17^{th}$ (1985) 833–36.

Bresser, W.; Boolchand, P.; Suranyi, P., Rigidity percolation and molecular clustering in network glasses, Phys. Rev. Lett. 56 (1986) 2493–2496.

Bresser, W.J.; Boolchand, P.; Suranyi, P.; de Neufville, J.P, Intrinsically broken chalcogen chemical order in stoichiometric glasses, Journal de Physique 42 (1981) C4–193–C4–196.

Bresser, W.J.; Boolchand, P.; Suranyi, P.; Hernandez, J.G., Molecular phase separation and cluster size in GeSe2 glass, Hyperfine Interactions 27 (1986) 389–392.

Cahen, D.; Gilet, J.–M.; Schmitz, C.; Chernyak, L.; Gartsman, K.; Jakubowicz, A., Room–Temperature, electric field induced creation of stable devices in CuInSe2 Crystals, Science 258 (1992) 271–274.

Chatterjee, R.; Asokan, S.; Titus, S.S.K., Current–controlled negative–resistance behavior and memory switching in bulk As–Te–Se glasses, J. Phys. D: Appl. Phys. 27 (1994) 2624–2627.

Chen, C.H., Tai, K.L. , Whisker growth induced by Ag photodoping in glassy GexSe1–x films, Appl. Phys. Lett. 37 (1980) 1075–1077.

Chen, G.; Cheng, J., Role of nitrogen in the crystallization of silicon nitride–doped chalcogenide glasses, J. Am. Ceram. Soc. 82 (1999) 2934–2936.

Chen, G.; Cheng, J.; Chen, W., Effect of Si3N4 on chemical durability of chalcogenide glass, J. Non–Cryst. Solids 220 (1997) 249–253.

Cohen, M.H.; Neale, R.G.; Paskin, A., A model for an amorphous semiconductor memory device, J. Non–Cryst. Solids 8–10 (1972) 885–891.

Croitoru, N.; Lazarescu, M.; Popescu, C.; Telnic, M.; and Vescan, L., Ohmic and non–ohmic conduction in some amorphous semiconductors, J. Non–Cryst. Solids 8–10 (1972) 781–786.

Dalven, R.; Gill, R., Electrical properties of beta–Ag2Te and beta–Ag2Se from 4.2 to 300K, J. Appl. Phys. 38 (1967) 753–756.

Davis, E.A., Semiconductors without form, Search 1 (1970) 152–155.

Dearnaley, G.; Stoneham, A.M.; Morgan, D.V., Electrical phenomena in amorphous oxide films, Rep. Prog. Phys. 33 (1970) 1129–1191.

Dejus, R.J.; Susman, S.; Volin, K.J.; Montague, D.G.; Price, D.L. Structure of Vitreous Ag–Ge–Se, J. Non–Cryst. Solids 143 (1992) 162–180.

den Boer, W., Threshold switching in hydrogenated amorphous silicon, Appl. Phys. Lett. 40 (1982) 812–813.

Drusedau, T.P.; Panckow, A.N.; Klabunde, F., The hydrogenated amorphous silicon/nanodisperse metal (SIMAL) system–Films of unique electronic properties, J. Non–Cryst. Solids 198–200 (1996) 829–832.

El Bouchairi, B.; Bernede, J.C.; Burgaud, P., Properties of Ag2–xSe1+x/n–Si diodes, Thin Solid Films 110 (1983) 107–113.

El Gharras, Z.; Bourahla, A.; Vautier, C., Role of photoinduced defects in amorphous GexSe1-x photoconductivity, J. Non–Cryst. Solids 155 (1993) 171–179.

El Ghrandi, R.; Calas, J.; Galibert, G.; Averous, M., Silver photodissolution in amorphous chalcogenide thin films, Thin Solid Films 218 (1992)259–273.

El Ghrandi, R.; Calas, J.; Galibert, G., Ag dissolution kinetics in amorphous GeSe5.5 thin films from "in–situ" resistance measurements vs time. Phys. Stat. Sol. (a) 123 (1991) 451–460.

El–kady, Y.L., The threshold switching in semiconducting glass Ge21Se17Te62, Indian J. Phys. 70A (1996) 507–516.

Elliott, S.R., A unified mechanism for metal photodissolution in amorphous chalcogenide materials, J. Non–Cryst. Solids 130 (1991) 85–97.

Elliott, S.R., Photodissolution of metals in chalcogenide glasses: A unified mechanism, J. Non–Cryst. Solids 137–138 (1991) 1031–1034.

Elsamanoudy, M.M.; Hegab, N.A.; Fadel, M., Conduction mechanism in the pre–switching state of thin films containing Te As Ge Si, Vacuum 46 (1995) 701–707.

El–Zahed, H.; El–Korashy, A., Influence of composition on the electrical and optical properties of Ge20BixSe80-x films, Thin Solid Films 376 (2000) 236–240.

Fadel, M., Switching phenomenon in evaporated Se–Ge–As thin films of amorphous chalcogenide glass, Vacuum 44 (1993) 851–855.

Fadel, M.; El–Shair, H.T., Electrical, thermal and optical properties of Se75Ge7Sb18, Vacuum 43 (1992) 253–257.

Feng, X. ;Bresser, W.J.; Boolchand, P., Direct evidence for stiffness threshold in Chalcogenide glasses, Phys. Rev. Lett. 78 (1997) 4422–4425.

Feng, X.; Bresser, W.J.; Zhang, M.; Goodman, B.; Boolchand, P., Role of network connectivity on the elastic, plastic and thermal behavior of covalent glasses, J. Non–Cryst. Solids 222 (1997) 137–143.

Fischer–Colbrie, A.; Bienenstock, A.; Fuoss, P.H.; Marcus, M.A., Structure and bonding in photodiffused amorphous Ag–GeSe2 thin films, Phys. Rev. B 38 (1988) 12388–12403.

Fleury, G.; Hamou, A.; Viger, C.; Vautier, C., Conductivity and crystallization of amorphous selenium, Phys. Stat. Sol. (a) 64 (1981) 311–316.

Fritzsche, H. Optical and electrical energy gaps in amorphous semiconductors, J. Non–Cryst. Solids 6 (1971) 49–71.

Fritzsche, H., Electronic phenomena in amorphous semiconductors, Annual Reviews of Materials Science 2 (1972) 697–744.

Gates, B.; Wu, Y.; Yin, Y.; Yang, P.; Xia, Y., Single–crystalline nanowires of Ag2Se can be synthesized by templating against nanowires of trigonal Se, J. Am. Chem. Soc. (2001) currently ASAP.

Gosain, D.P.; Nakamura, M.; Shimizu, T.; Suzuki, M.; Okano, S., Nonvolatile memory based on reversible phase transition phenomena in telluride glasses, Jap. J. Appl. Phys. 28 (1989) 1013–1018.

Guin, J.–P.; Rouxel, T.; Keryvin, V.; Sangleboeuf, J.–C.; Serre, I.; Lucas, J., Indentation creep of Ge–Se chalcogenide glasses below Tg: elastic recovery and non–Newtonian flow, J. Non–Cryst. Solids 298 (2002) 260–269.

Guin, J.–P.; Rouxel, T.; Sangleboeuf, J.–C.; Melscoet, I.; Lucas, J., Hardness, toughness, and scratchability of germanium–selenium chalcogenide glasses, J. Am. Ceram. Soc. 85 (2002) 1545–52.

Gupta, Y.P., On electrical switching and memory effects in amorphous chalcogenides, J. Non–Cryst. Sol. 3 (1970) 148–154.

Haberland, D.R.; Stiegler, H., New experiments on the charge–controlled switching effect in amorphous semiconductors, J. Non–Cryst. Solids 8–10 (1972) 408–414.

Haifz, M.M.; Ibrahim, M.M.; Dongol, M.; Hammad, F.H., Effect of composition on the structure and electrical properties of As–Se–Cu glasses, J. Apply. Phys. 54 (1983) 1950–1954.

Hajto, J.; Rose, M.J.; Osborne, I.S.; Snell, A.J.; Le Comber, P.G.; Owen, A.E., Quantization effects in metal/a–Si:H/metal devices, Int. J. Electronics 73 (1992) 911–913.

Hajto, J.; Hu, J.; Snell, A.J.; Turvey, K.; Rose, M., DC and AC measurements on metal/a–Si:H/metal room temperature quantised resistance devices, J. Non–Cryst. Solids 266–269 (2000) 1058–1061.

Hajto, J.; McAuley, B.; Snell, A.J.; Owen, A.E., Theory of room temperature quantized resistance effects in metal–a–Si:H–metal thin film structures, J. Non–Cryst. Solids 198–200 (1996) 825–828.

Hajto, J.; Owen, A.E.; Snell, A.J.; Le Comber, P.G.; Rose, M.J., Analogue memory and ballistic electron effects in metal–amorphous silicon structures, Phil. Mag. B 63 (1991) 349–369.

Hayashi, T.; Ono, Y.; Fukaya, M.; Kan, H., Polarized memory switching in amorphous Se film, Japan. J. Appl. Phys. 13 (1974) 1163–1164.

Hegab, N.A.; Fadel, M.; Sedeek, K., Memory switching phenomena in thin films of chalcogenide semiconductors, Vacuum 45 (1994) 459–462.

Hirose, Y.; Hirose, H., Polarity–dependent memory switching and behavior of Ag dendrite in Ag–photodoped amorphous As2S3 films, J. Appl. Phys. 47 (1976) 2767–2772.

Hong, K.S.; Speyer, R.F., Switching behavior in II–IV–V2 amorphous semiconductor systems, J. Non–Cryst. Solids 116 (1990) 191–200.

Hosokawa, S., Atomic and electronic structures of glassy GexSe1-x around the stiffness threshold composition, J. Optoelectronics and Advanced Materials 3 (2001) 199–214.

Hu, J.; Snell, A.J.; Hajto, J.; Owen, A.E., Constant current forming in Cr/p+a–/Si:H/V thin film devices, J. Non–Cryst. Solids 227–230 (1998) 1187–1191.

Hu, J.; Hajto, J.; Snell, A.J.; Owen, A.E.; Rose, M.J., Capacitance anomaly near the metal–non–metal transition in Cr–hydrogenated amorphous Si–V thin–film devices, Phil. Mag. B 74 (1996) 37–50.

Hu, J.; Snell, A.J.; Hajto, J.; Owen, A.E., Current–induced instability in Cr–p+a–Si:H–V thin film devices, Phil. Mag. B 80 (2000) 29–43.

Iizima, S.; Sugi, M.; Kikuchi, M.; Tanaka, K., Electrical and thermal properties of semiconducting glasses As–Te–Ge, Solid State Comm. 8 (1970) 153–155.

Ishikawa, R.; Kikuchi, M., Photovoltaic study on the photo–enhanced diffusion of Ag in amorphous films of Ge2S3, J. Non–Cryst. Solids 35 & 36 (1980) 1061–1066.

Iyetomi, H.; Vashishta, P.; Kalia, R.K., Incipient phase separation in Ag/Ge/Se glasses: clustering of Ag atoms, J. Non–Cryst. Solids 262 (2000) 135–142.

Jones, G.; Collins, R.A., Switching properties of thin selenium films under pulsed bias, Thin Solid Films 40 (1977) L15–L18.

Joullie, A.M.; Marucchi, J., On the DC electrical conduction of amorphous As2Se7 before switching, Phys. Stat. Sol. (a) 13 (1972) K105–K109.

Joullie, A.M.; Marucchi, J. Electrical properties of the amorphous alloy As2Se5, Mat. Res. Bull. 8 (1973) 433–442.

Kaplan, T.; Adler, D., Electrothermal switching in amorphous semiconductors. J. Non–Cryst. Solids 8–10 (1972) 538–543.

Kawaguchi, T.; Maruno, S.; Elliott, S.R., Optical, electrical, and structural properties of amorphous Ag–Ge–S and Ag–Ge–Se films and comparison of photoinduced and thermally induced phenomena of both systems, J. Appl. Phys. 79 (1996) 9096–9104.

Kawaguchi, T.; Masui, K., Analysis of change in optical transmission spectra resulting from Ag photodoping in chalcogenide film, Japn. J. Appl. Phys. 26 (1987) 15–21.

Kawasaki, M.; Kawamura, J.; Nakamura, Y.; Aniya, M., Ionic conductivity of Agx(GeSe3)1–x (0<=x<=0.571) glasses, Solid state Ionics 123 (1999) 259–269.

Kluge, G.; Thomas, A.; Klabes, R.; Grotzschel, R., Silver photodiffusion in amorphous GexSe100–x, J. Non–Cryst. Solids 124 (1990) 186–193.

Kolobov, A.V., On the origin of p–type conductivity in amorphous chalcogenides, J. Non–Cryst. Solids 198–200 (1996) 728–731.

Kolobov, A.V., Lateral diffusion of silver in vitreous chalcogenide films, J. Non–Cryst. Solids 137–138 (1991) 1027–1030.

Korkinova, Ts.N.; Andreichin,R.E., Chalcogenide glass polarization and the type of contacts, J. Non–Cryst. Solids 194 (1996) 256–259.

Kotkata, M.F.; Afif, M.A.; Labib, H.H.; Hegab, N.A.; Abdel–Aziz, M.M., Memory switching in amorphous GeSeTl chalcogenide semiconductor films, Thin Solid Films 240 (1994) 143–146.

Lakshminarayan, K.N.; Srivastava, K.K.; Panwar, O.S.; Dumar, A., Amorphous semiconductor devices: memory and switching mechanism, J. Instn Electronics & Telecom. Engrs 27 (1981) 16–19.

Lal, M.; Goyal, N., Chemical bond approach to study the memory and threshold switching chalcogenide glasses, Indian Journal of pure & appl. phys. 29 (1991) 303–304.

Leimer, F.; Stotzel, H.; Kottwitz, A., Isothermal electrical polarisation of amorphous GeSe films with blocking Al contacts influenced by Poole–Frenkel conduction, Phys. Stat. Sol. (a) 29 (1975) K129–K132.

Leung, W.; Cheung, N.; Neureuther, A.R., Photoinduced diffusion of Ag in GexSe1–x glass, Appl. Phys. Lett. 46 (1985) 543–545.

Matsushita, T.; Yamagami, T.; Okuda, M., Polarized memory effect observed on Se–SnO2 system, Jap. J. Appl. Phys. 11 (1972) 1657–1662.

Matsushita, T.; Yamagami, T.; Okuda, M., Polarized memory effect observed on amorphous selenium thin films, Jpn. J. Appl. Phys. 11 (1972) 606.

Mazurier, F.; Levy, M.; Souquet, J.L, Reversible and irreversible electrical switching in TeO2–V2O5 based glasses, Journal de Physique IV 2 (1992) C2–185–C2–188.

Messoussi, R.; Bernede, J.C.; Benhida, S.; Abachi, T.; Latef, A., Electrical characterization of M/Se structures (M=Ni, Bi), Mat. Chem. And Phys. 28 (1991) 253–258.

Mitkova, M.; Boolchand, P., Microscopic origin of the glass forming tendency in chalcogenides and constraint theory, J. Non–Cryst. Solids 240 (1998) 1–21.

Mitkova, M.; Kozicki, M.N., Silver incorporation in Ge–Se glasses used in programmable metallization cell devices, J. Non–Cryst. Solids 299–302 (2002) 1023–1027.

Mitkova, M.; Wang, Y.; Boolchand, P., Dual chemical role of Ag as an additive in chalcogenide glasses, Phys. Rev. Lett. 83 (1999) 3848–3851.

Miyatani, S.–y., Electronic and ionic conduction in (AgxCu1–x)2Se, J. Phys. Soc. Japan 34 (1973) 423–432.

Miyatani, S.–y., Electrical properties of Ag2Se, J. Phys. Soc. Japan 13 (1958) 317.

Miyatani, S.–y., Ionic conduction in beta–Ag2Te and beta–Ag2Se, Journal Phys. Soc. Japan 14 (1959) 996–1002.

Mott, N.F., Conduction in glasses containing transition metal ions, J. Non–Cryst. Solids 1 (1968) 1–17.

Nakayama, K.; Kitagawa, T.; Ohmura, M.; Suzuki, M., Nonvolatile memory based on phase transitions in chalcogenide thin films, Jpn. J. Appl. Phys. 32 (1993) 564–569.

Nakayama, K.; Kojima, K.; Hayakawa, F.; Imai, Y.; Kitagawa, A.; Suzuki, M., Submicron nonvolatile memory cell based on reversible phase transition in chalcogenide glasses, Jpn. J. Appl. Phys. 39 (2000) 6157–6161.

Nang, T.T.; Okuda, M.; Matsushita, T.; Yokota, S.; Suzuki, A., Electrical and optical parameters of GexSe1–x amorphous thin films, Jap. J. App. Phys. 15 (1976) 849–853.

Narayanan, R.A.; Asokan, S.; Kumar, A., Evidence concerning the effect of topology on electrical switching in chalcogenide network glasses, Phys. Rev. B 54 (1996) 4413–4415.

Neale, R.G.; Aseltine, J.A., The application of amorphous materials to computer memories, IEEE transactions on electron dev. Ed–20 (1973) 195–209.

Ovshinsky S.R.; Fritzsche, H., Reversible structural transformation in amorphous semiconductors for memory and logic, Mettalurgical transactions 2 (1971) 641–645.

Ovshinsky, S.R., Reversible electrical switching phenomena in disordered structures, Phys. Rev. Lett 21 (1968) 1450–1453.

Owen, A.E.; LeComber, P.G.; Sarrabayrouse, G.; Spear, W.E., New amorphous–silicon electrically programmable nonvolatile switching device, IEE Pro. 129 (1982) 51–54.

Owen, A.E.; Firth, A.P.; Ewen, P.J.S., Photo–induced structural and physico–chemical changes in amorphous chalcogenide semiconductors, Phil. Mag. B 52 (1985) 347–362.

Owen, A.E.; Le Comber, P.G.; Hajto, J.; Rose, M.J.; Snell, A.J., Switching in amorphous devices, Int. J. Electronics 73 (1992) 897–906.

Pearson, A.D.; Miller, C.E., Filamentary conduction in semiconducting glass diodes, App. Phys. Lett. 14 (1969) 280–282.

Pinto, R.; Ramanathan, K.V., Electric field induced memory switching in thin films of the chalcogenide system Ge–As–Se, Appl. Phys. Lett. 19 (1971) 221–223.

Popescu, C., The effect of local non–uniformities on thermal switching and high field behavior of structures with chalcogenide glasses, Solid–state electronics 18 (1975) 671–681.

Popescu, C.; Croitoru, N., The contribution of the lateral thermal instability to the switching phenomenon, J. Non–Cryst. Solids 8–10 (1972) 531–537.

Popov, A.I.; Geller, I.KH.; Shemetova, V.K., Memory and threshold switching effects in amorphous selenium, Phys. Stat. Sol. (a) 44 (1977) K71–K73.

Prakash, S.; Asokan, S.; Ghare, D.B., Easily reversible memory switching in Ge–As–Te glasses, J. Phys. D: Appl. Phys. 29 (1996) 2004–2008.

Rahman, S.; Sivarama Sastry, G., Electronic switching in Ge–Bi–Se–Te glasses, Mat. Sci. and Eng. B12 (1992) 219–222.

Ramesh, K.; Asokan, S.; Sangunni, K.S.; Gopal, E.S.R., Electrical Switching in germanium telluride glasses doped with Cu and Ag, Appl. Phys. A 69 (1999) 421–425.

Rose,M.J.;Hajto,J.;Lecomber,P.G.;Gage,S.M.;Choi,W.K.;Snell,A.J.;Owen,A.E., Amorphous silicon analogue memory devices, J. Non–Cryst. Solids 115 (1989) 168–170.

Rose,M.J.;Snell,A.J.;Lecomber,P.G.;Hajto,J.;Fitzgerald, A.G.;Owen,A.E., Aspects of non–volatility in a–Si:H memory devices, Mat. Res. Soc. Symp. Proc. V 258, 1992, 1075–1080.

Schuocker, D.; Rieder, G., On the reliability of amorphous chalcogenide switching devices, J. Non–Cryst. Solids 29 (1978) 397–407.

Sharma, A.K.; Singh, B., Electrical conductivity measurements of evaporated selenium films in vacuum, Proc. Indian Natn. Sci. Acad. 46, A, (1980) 362–368.

Sharma, P., Structural, electrical and optical properties of silver selenide films, Ind. J. Of pure and applied phys. 35 (1997) 424–427.

Snell, A.J.; Lecomber, P.G.; Hajto, J.; Rose, M.J.; Owen, A.E.; Osborne, I.L., Analogue memory effects in metal/a–Si:H/metal memory devices, J. Non–Cryst. Solids 137–138 (1991) 1257–1262.

Snell, A.J.; Hajto, J.;Rose, M.J.; Osborne, L.S.; Holmes, A.; Owen, A.E.; Gibson, R.A.G., Analogue memory effects in metal/a–Si:H/metal thin film structures, Mat. Res. Soc. Symp. Proc. V 297, 1993, 1017–1021.

Steventon, A.G., Microfilaments in amorphous chalcogenide memory devices, J. Phys. D: Appl. Phys. 8 (1975) L120–L122.

Steventon, A.G., The switching mechanisms in amorphous chalcogenide memory devices, J. Non–Cryst. Solids 21 (1976) 319–329.

Stocker, H.J., Bulk and thin film switching and memory effects in semiconducting chalcogenide glasses, App. Phys. Lett. 15 (1969) 55–57.

Tanaka, K., Ionic and mixed conductions in Ag photodoping process, Mod. Phys. Lett B 4 (1990) 1373–1377.

Tanaka, K.; Iizima, S.; Sugi, M.; Okada, Y.; Kikuchi, M., Thermal effects on switching phenomenon in chalcogenide amorphous semiconductors, Solid State Comm. 8 (1970) 387–389.

Thornburg, D.D., Memory switching in a Type I amorphous chalcogenide, J. Elect. Mat. 2 (1973) 3–15.

Thornburg, D.D., Memory switching in amorphous arsenic triselenide, J. Non–Cryst. Solids 11 (1972) 113–120.

Thornburg, D.D.; White, R.M., Electric field enhanced phase separation and memory switching in amorphous arsenic triselenide, Journal(??) (1972) 4609–4612.

Tichy, L.; Ticha, H., Remark on the glass–forming ability in GexSe1-x and AsxSe1-x systems, J. Non–Cryst. Solids 261 (2000) 277–281.

Titus, S.S.K.; Chatterjee, R.; Asokan, S., Electrical switching and short–range order in As–Te glasses, Phys. Rev. B 48 (1993) 14650–14652.

Tranchant,S.;Peytavin,S.;Ribes,M.;Flank,A.M.;Dexpert, H.;Lagarde,J.P., Silver chalcogenide glasses Ag–Ge–Se: Ionic conduction and exafs structural investigation, Transport–structure relations in fast ion and mixed conductors Proceedings of the 6th Riso International symposium. Sep. 9–13, 1985.

Tregouet, Y.; Bernede, J.C., Silver movements in Ag2Te thin films: switching and memory effects, Thin Solid Films 57 (1979) 49–54.

Uemura, O.; Kameda, Y.; Kokai, S.; Satow, T., Thermally induced crystallization of amorphous Ge0.4Se0.6, J. Non–Cryst. Solids 117–118 (1990) 219–221.

Uttecht, R.; Stevenson, H.; Sie, C.H.; Griener, J.D.; Raghavan, K.S., Electric field induced filament formation in As–Te–Ge glass, J. Non–Cryst. Solids 2 (1970) 358–370.

Viger, C.; Lefrancois, G.; Fleury, G., Anomalous behaviour of amorphous selenium films, J. Non–Cryst. Solids 33 (1976) 267–272.

Vodenicharov, C.; Parvanov,S.; Petkov,P., Electrode–limited currents in the thin–film M–GeSe–M system, Mat. Chem. And Phys. 21 (1989) 447–454.

Wang, S.–J.; Misium, G.R.; Camp, J.C.; Cen, K.–L.; Tigelaar, H.L., High–performance Metal/silicide antifuse, IEEE electron dev. Lett. 13 (1992)471–472.

Weirauch, D.F., Threshold switching and thermal filaments in amorphous semiconductors, App. Phys. Lett. 16 (1970) 72–73.

West, W.C.; Sieradzki, K.; Kardynal, B.; Kozicki, M.N., Equivalent circuit modeling of the Ag|As0.24S0.36Ag0.40|Ag System prepared by photodissolution of Ag. J. Electrochem. Soc. 145 (1998) 2971–2974.

West, W.C., Electrically erasable non–volatile memory via electrochemical deposition of multifractal aggregates, Ph.D. Dissertation, ASU 1998.

Zhang, M.; Mancini, S.; Bresser, W.; Boolchand, P., Variation of glass transition temperature, Tg, with average coordination number, <m>, in network glasses: evidence of a threshold behavior in the slope |dTg/d<m>| at the rigidity percolation threshold (<m>=2.4), J. Non–Cryst. Solids 151 (1992) 149–154.

Yoji Kawamoto et al., "Ionic Conduction in $As_2S_3$–$Ag_2GeS_2GeS$–$Ag_2S$ and $P_2S_5$–$Ag_2S$ Glasses,", Journal of Non–Crystalline Solids 20(1976), pp. 393–404.

* cited by examiner

PROGRAMMABLE CONDUCTOR RANDOM ACCESS MEMORY AND METHOD FOR SENSING SAME

BACKGROUND OF THE INVENTION

1. Field of the Invention

The present invention relates to integrated memory circuits. More specifically, it relates to a method for sensing the content of a programmable conductor random access memory (PCRAM) cell.

2. Description of Prior Art

DRAM integrated circuit arrays have existed for more than thirty years and their dramatic increase in storage capacity has been achieved through advances in semiconductor fabrication technology and circuit design technology. The tremendous advances in these two technologies have also achieved higher and higher levels of integration that permit dramatic reductions in memory array size and cost, as well as increased process yield.

A DRAM memory cell typically comprises, as basic components, an access transistor (switch) and a capacitor for storing a binary data bit in the form of a charge. Typically, a charge of one polarity is stored on the capacitor to represent a logic HIGH (e.g., binary "1"), and a stored charge of the opposite polarity represents a logic LOW (e.g., binary "0"). The basic drawback of a DRAM is that the charge on the capacitor eventually leaks away and therefore provisions must be made to "refresh" the capacitor charge or else the data bit stored by the memory cell is lost.

The memory cell of a conventional SRAM, on the other hand, comprises, as basic components, an access transistor or transistors and a memory element in the form of two or more integrated circuit devices interconnected to function as a bistable latch. An example of such a bistable latch is cross-coupled inverters. Bistable latches do not need to be "refreshed," as in the case of DRAM memory cells, and will reliably store a data bit indefinitely as long as they continue to receive supply voltage.

Efforts continue to identify other forms of non-volatile or semi-volatile memory elements. Recent studies have focused on resistive materials that can be programmed to exhibit either high or low stable ohmic states. A programmable resistance element of such material could be programmed (set) to a high resistive state to store, for example, a binary "1" data bit or programmed to a low resistive state to store a binary "0" data bit. The stored data bit could then be retrieved by detecting the magnitude of a readout current switched through the resistive memory element by an access device, thus indicating the stable resistance state it had previously been programmed to.

Recently programmable conductor memory elements have been devised. For example, chalcogenide glasses which have switchable resistive states have been investigated as data storage memory cells for use in memory devices, such as DRAM memory devices. U.S. Pat. Nos. 5,761,115, 5,896,312, 5,914,893, and 6,084,796 all describe this technology and are incorporated herein by reference. One characteristic of a programmable conductor memory element such as one formed of the chalcogenide glasses described above is that it typically includes chalcogenide glass which can be doped with metal ions and a cathode and anode spaced apart on one or more surfaces of the glass. The doped glass has a normal and stable high resistance state. Application of a voltage across the cathode and anode causes a stable low resistance path to occur in the glass. Thus, stable low and high resistance states can be used to store binary data.

A programmable conductor memory element formed of a doped chalcogenide glass material typically has a stable high resistance state which may be programmed to a low resistance state by applying a voltage across the memory element. To restore the memory cell to a high resistive state, typically one needs to program the cell with a negative, or inverse voltage which is equal to or greater that the voltage used to program the memory element to the low resistance state. One particularly promising programmable conductor chalcogenide glass has a Ge:Se glass composition and is doped with silver.

Suitable circuitry for reading data from an array of programmable conductor memory elements has not yet been fully developed. Accordingly, in order to realize a functional programmable conductor memory, appropriate read circuitry is required to nondestructively sense data stored in the memory elements of the array.

SUMMARY OF THE INVENTION

A sense circuit for reading a resistance level of a programmable conductor random access memory (PCRAM) cell is provided. A voltage potential difference is introduced across a PCRAM cell by activating an access transistor from a raised rowline voltage. Both a digit line and a digit complement reference line are precharged to a first predetermined voltage. The cell being sensed has the precharged voltage discharged through the resistance of the programmable conductor memory element of the PCRAM cell. A comparison is made of the voltage read at the digit line and at the reference conductor. If the voltage at the digit line is greater than the reference voltage, the cell is read as a high resistance value (e.g., logic HIGH); however, if the voltage measured at the digit line is lower than that of the reference voltage, the cell is read as a low resistance value (e.g., logic LOW). In an additional aspect of the invention, in order to rewrite a logic "HIGH" into the cell, the rowline associated with the cell being sensed may be raised to a higher voltage after the cell is sensed.

BRIEF DESCRIPTION OF THE DRAWINGS

The foregoing and other advantages and features of the invention will become more apparent from the detailed description of preferred embodiments of the invention given below with reference to the accompanying drawings in which.

DETAILED DESCRIPTION OF PREFERRED EMBODIMENTS

The present invention will be described as set forth in exemplary embodiments described below in connection with FIGS. 1–8. Other embodiments may be realized and other changes may be made to the disclosed embodiments without departing from the spirit or scope of the present invention.

In accordance with an exemplary embodiment of the invention, a pair of memory arrays are coupled to a respective plurality of sense amplifiers where each memory array is made up of a plurality of programmable conductor memory cells. In order to read a logical state of a given memory cell, an appropriate voltage difference must be placed across the programmable conductor memory element. The voltage difference must be sufficient to enable a read operation of the programmable conductor memory element, but insufficient to enable the element to be programmed (or written to). Once the appropriate voltage difference exists across the memory element, a digit (bit) line voltage value is discharged through the memory cell and through the programmable conductor memory element. A predetermined period of time after the discharging begins, a comparison is made, via a sense amplifier associated with the given memory cell, between the digit line voltage and a digit complement reference voltage at a reference bit line.

Figure 1:
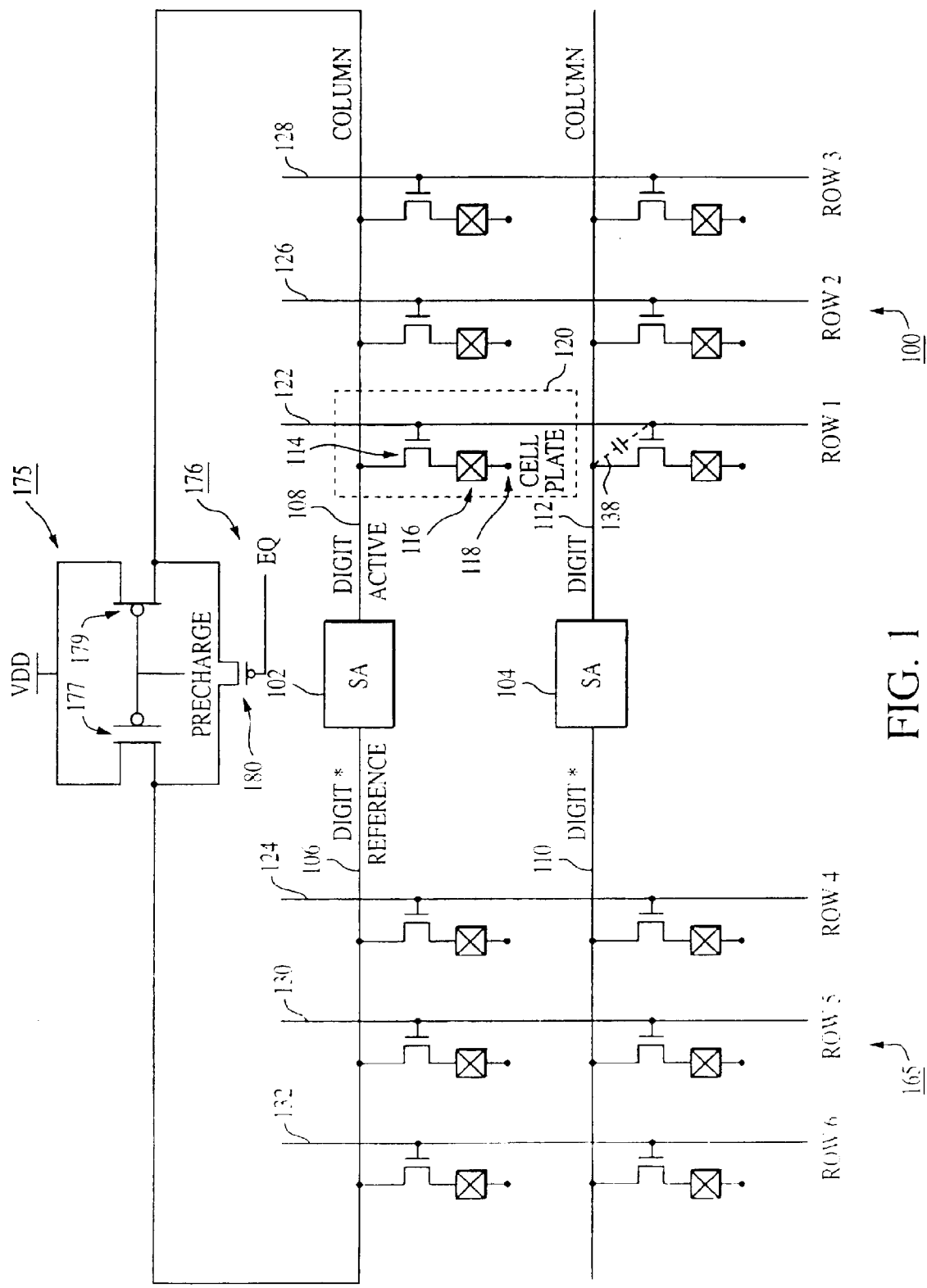
FIG. 1 depicts two memory arrays each employing a plurality of PCRAM memory cells, in accordance with an exemplary embodiment of the invention.

If after the predetermined time, the digit line voltage is higher than the voltage at the reference line, then a high resistive state is detected and the reference line is grounded. If, however, the digit line voltage is lower than the voltage at the reference line 106, then a low resistive state is detected and the digit line is grounded. The reference voltage is supplied by a digit complement line associated with an adjacent memory array. The two adjacent memory arrays respectively serve as sources for the a reference voltage when the other of the two memory arrays contains a selected memory cell. FIG. 1 provides greater detail of an exemplary embodiment of the invention.

FIG. 1 depicts a portion of a pair of memory arrays 100, 165, each having a plurality of columns 108, 112, 106, 110 and rows 122, 126, 128, 124, 130, 132. At each intersection of columns and rows there is formed a programmable conductor random access memory (PCRAM) cell such as memory cell 120. Sense amplifier 102 receives inputs from column line 108 and column line 106. Sense amplifier 104 receives inputs from column line 112 and column line 110. Each sense amplifier 102, 104 is configured to compare a voltage at a digit (bit) line (e.g., 108) of a cell 120 being read with a voltage at a reference line (e.g., 106) in order to determine whether the sensed memory cell 120 is storing a value of logic HIGH or logic LOW. In the FIG. 1 arrangement, if cell 120 is being read, a voltage at digit line 108 is compared with a reference voltage on complementary digit line 106 by sense amplifier 102.

Depending upon which side of the sense amplifier 102 contains the memory cell 120 of interest, the digit line 108 or 106 acts as the digit line D and the digit line 106 on the other side acts as the reference digit line D*. In this example, it is assumed that memory cell 120 is the cell being sensed. The column line 108 associated with memory cell 120 is referred to as the digit (bit) line D. Column line 106 is referred to as the digit complement line D*, or the reference line.

Each programmable conductor memory cell 120 consists of an access transistor 114 and a programmable conductor memory element 116. One end of the programmable conductor memory element 116 is coupled to a cell plate 118. The other end of the programmable conductor memory element 116 is coupled to a source/drain terminal of access transistor 114. Another source/drain terminal of access transistor 114 is coupled to digit line 108. A gate of the access transistor 114 is coupled to a rowline 122 associated with the memory cell 120.

Further, the D and D* lines are coupled to a pre-charging circuit 175 for precharging the D and D* lines to a predetermined voltage value (e.g., Vdd). The D* line is coupled to one terminal of p-type complementary metal oxide semiconductor (CMOS) transistor 177 and another terminal of transistor 177 is coupled to Vdd. The D line is coupled to one terminal of p-type CMOS transistor 179 and another terminal of transistor 179 is coupled to Vdd. The gates of both transistors 177, 179 are coupled together for receiving a precharge control signal. When the precharge control signal is received, both transistors 177, 179 are turned on and both the digit line D and digit-complement line D* are charged to Vdd. FIG. 1 also shows an equilibrate circuit 176 for equalizing the voltage on the D and D* digit lines. After the D and D* are precharged to Vdd by a precharge signal, the lines are then equilibrated by an equilibrate EQ signal applied to transistor 180.

Figure 2A:
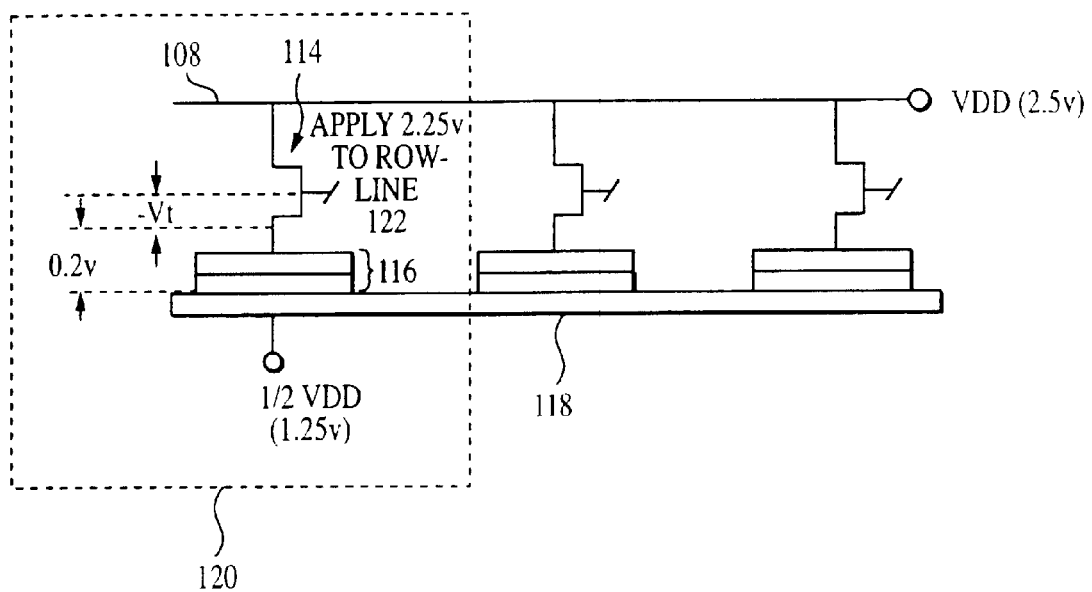
FIGS. 2(a)–2(d) each depict a PCRAM memory cell of FIG. 1.

Turning to FIG. 2(a), a simplified schematic diagram of programmable conductor memory cell 120 is depicted. Using the representative cell 120 to describe the invention, digit line D 108 is coupled to Vdd during precharge and also coupled to a first terminal of access transistor 114. Access transistor 114 is depicted as n-type CMOS transistor; however, access transistor 114 may easily be replaced with a p-type CMOS transistor as long as the corresponding polarities of the other components and voltages are modified accordingly. A second terminal of transistor 114 is coupled to a first terminal of programmable conductor memory element 116. As mentioned above, programmable conductor memory element 116 may be made of chalcogenide glass, or any other bistable resistive material that allows for the storage of binary values. The programmable conductor memory element 116 is coupled to cell plate 118 which is also a common conductor for a plurality of programmable conductor memory elements. The cell plate 118 is tied to a voltage terminal for providing a predetermined voltage level (e.g., Vdd/2) to the cell plate 118. A gate of access transistor 114 is tied to rowline 122. When sufficient voltage is applied to rowline 122, access transistor 114 is turned on and conducting and couples the digit line D 108 to the programmable conductor memory element 116.

The voltage value applied to rowline 122 dictates what operation is being performed on the programmable conductor memory element 116. For instance, assuming the D line 108 is tied to Vdd (e.g., 2.5V) and the cell plate is tied to ½ Vdd (e.g., 1.25V), in order to activate the access transistor 114, a minimum of 2.05V must be applied to its gate. A voltage of 2.05V at the gate of access transistor 114 is sufficient to turn on transistor 114 since that creates a difference of potential of at least the threshold voltage (Vt), approximately 0.8V, between the gate and the source/drain terminal coupled to the cell plate 118.

While 2.05V applied to the gate of access transistor 114 is sufficient to turn it on, it is not sufficient for reading from or writing to the programmable conductor memory cell 120. In accordance with an exemplary embodiment of the invention, approximately 0.2V is required to be across the programmable conductor memory element 116 in order to read it. Further, in order to write (e.g., re-program its value) to the programmable conductor memory element 116, a minimum of 0.25V is required to be across it and the polarity of the 0.25V depends on whether a logic HIGH or a logic LOW is being rewritten to the memory element 116.

Figure 2B:
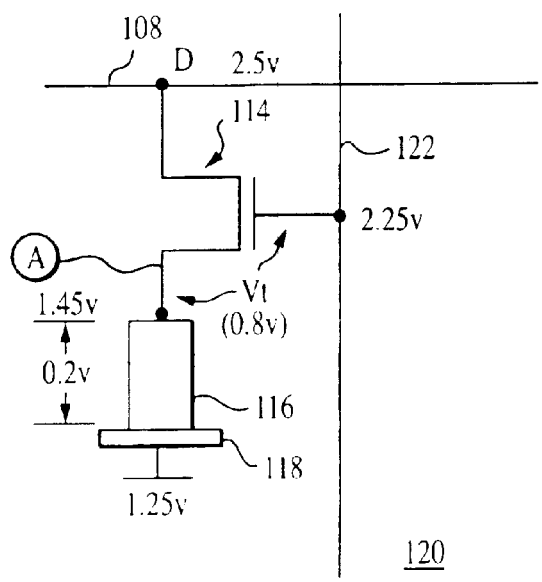

Turning to FIG. 2(b), the voltage levels and their polarities are discussed in greater detail. For a read operation, since approximately 0.2V is required across the programmable conductor memory element 116, a voltage of approximately 2.25V is applied to the rowline 122 coupled to the gate of access transistor 122. The threshold voltage, Vt, is subtracted from 2.25V and point A is approximately 1.45V. The cell plate being at 1.25V leaves a voltage drop of 0.2V across the programmable conductor memory element 116; a voltage sufficient for reading the contents of the element 116, but insufficient for writing to the element 116.

Figure 2C:
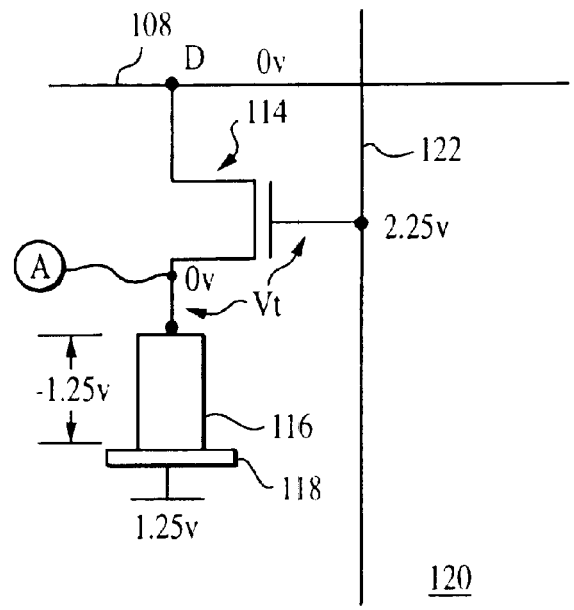

FIG. 2(c) depicts exemplary voltage levels and polarities for writing a logic LOW back into the programmable conductor memory element 116. As will be described in greater detail below, when a logic LOW level has been read as being stored by the programmable conductor memory cell 120, the D line 108 is grounded by the sense amplifier 102. Point A is also at approximately ground and, therefore, a voltage drop of approximately −1.25V is across the programmable contact and the logic LOW may be rewritten back into the programmable conductor memory element 116.

Figure 2D:
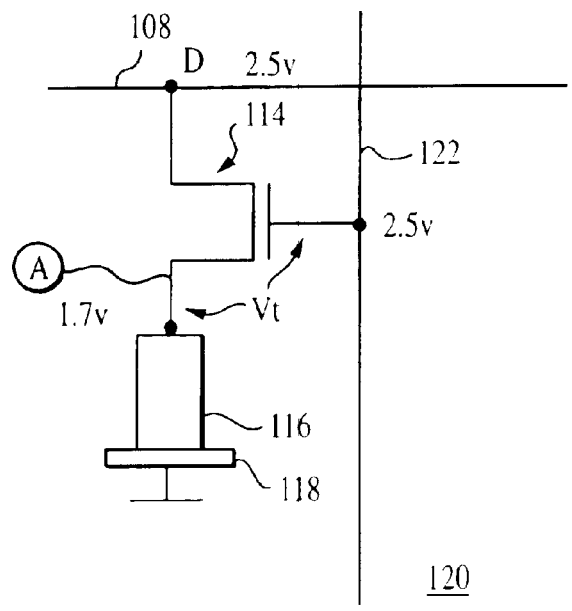

FIG. 2(d) depicts exemplary voltage levels and polarities for writing a logic HIGH back into the programmable conductor memory element 116. As will be described in greater detail below, when a logic HIGH level has been read as being stored by the programmable conductor memory cell 120, the D line 108 is boosted to approximately Vdd by the sense amplifier 102. Then, the rowline 122 is raised from approximately 2.25V (its voltage level during the read operation) to approximately Vdd, thereby placing a voltage of approximately 1.7V at point A. The 1.7V at point A creates a potential difference of approximately 0.45V across the programmable conductor memory element 116 in order to rewrite the logic HIGH level.

Figure 3:
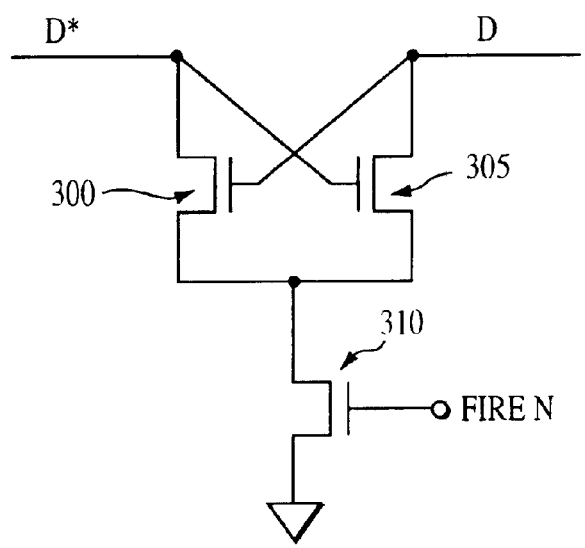
FIG. 3 depicts an N-sense amplifier as used in the FIG. 1 memory array.

Referring back to FIG. 1, the sense amplifier 102 includes an N-sense amplifier portion and a P-sense amplifier portion. FIG. 3 depicts the N-sense amplifier portion 350. A first terminal of N-sense amplifier 350 receives digit complement line D* (i.e., the column line in the memory array adjacent to the memory array that contains the memory cell of interest) and is also coupled to a gate of n-type CMOS transistor 305 and a first terminal of n-type CMOS transistor 300. A second terminal of N-sense amplifier 350 receives digit line D (i.e., the column line in the memory array that contains the cell of interest) and is also coupled to a gate of transistor 300 and a first terminal of transistor 305. A second terminal of transistor 300 and a second terminal of transistor 305 are coupled to a first terminal of CMOS transistor 310. A second terminal of transistor 310 is coupled to ground and a gate of transistor 310 receives a Fire N control signal. The Fire N control signal is received by the N-sense amplifier 350 a predetermined time after the desired memory cell rowline is fired, as will be described below.

Figure 4:
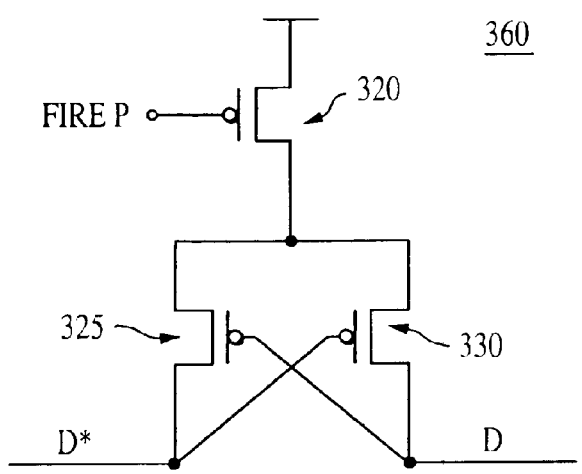
FIG. 4 depicts a P-sense amplifier as used in the FIG. 1 memory array.

FIG. 4 depicts a P-sense amplifier portion 360 of a sense amplifier such as sense amplifier 102. A first terminal of P-sense amplifier 360 receives digit complement line D* and is also coupled to a gate of p-type CMOS transistor 330 and a first terminal of p-type CMOS transistor 325. A second terminal of P-sense amplifier 360 receives digit line D and is also coupled to a gate of transistor 325 and a first terminal of transistor 330. A second terminal of transistor 325 and a second terminal of transistor 330 are coupled to a first terminal of transistor 320. A gate of transistor 320 receives a Fire P control signal. The Fire P control signal is received by the P-sense amplifier 360 a predetermined time after the Fire N control signal is received by the N-sense amplifier 350.

Figure 5:
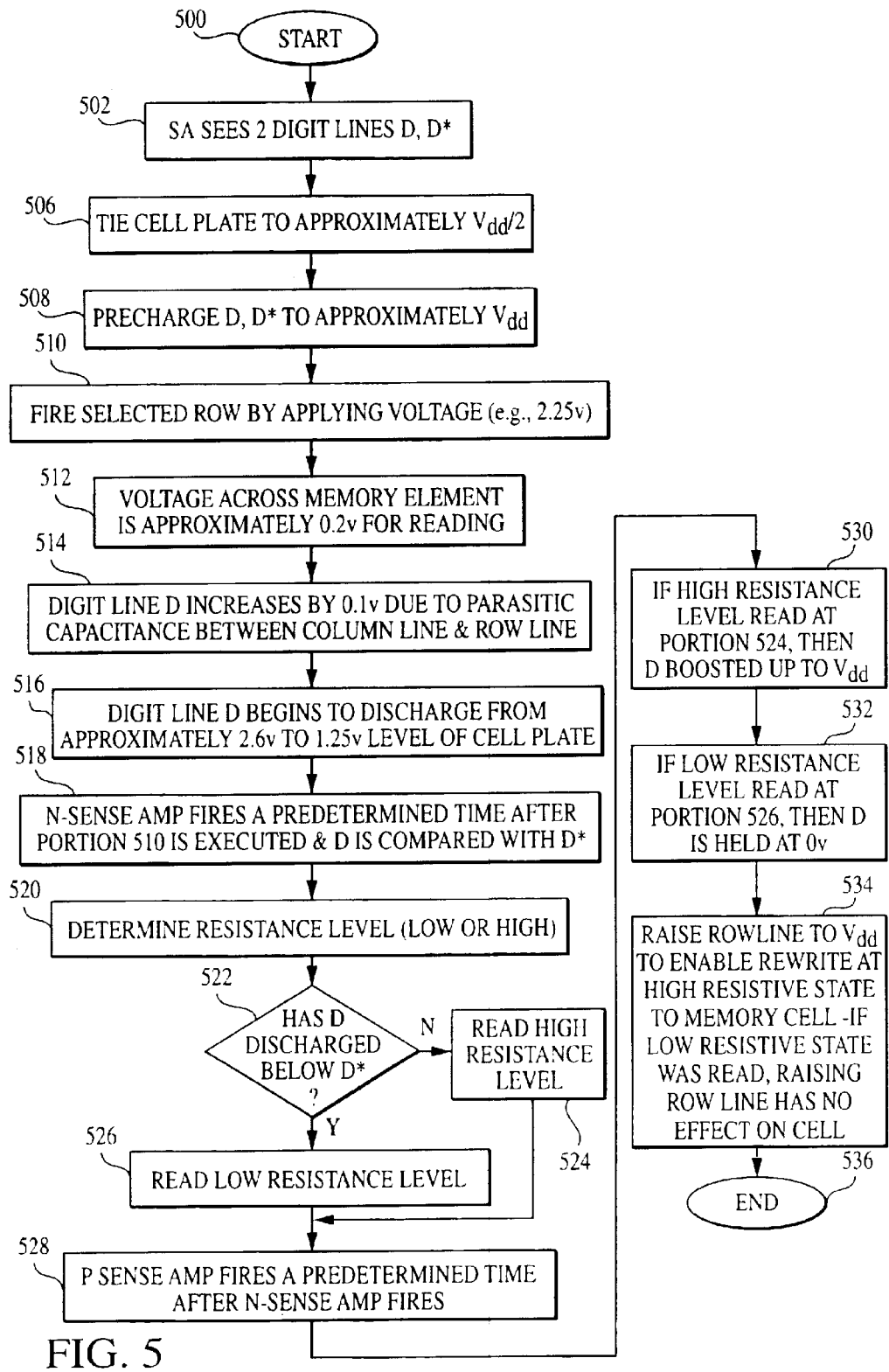
FIG. 5 depicts a flowchart describing an operational flow, in accordance with an exemplary embodiment of the invention.

Turning to FIG. 5, a flowchart describing an operational flow of the FIGS. 1 and 2 schematic diagrams is depicted, in accordance with an exemplary embodiment of the invention. In this exemplary process flow, the following parameters of the PCRAM cell are presumed: i) that the erase voltage to grow a dendrite in programmable conductor memory element 116 switching it to a high resistance state and thus write a logic "1" is 0.25V; (ii) that the erase current is approximately 10 μA; (iii) that the program voltage (write a "1" element to logic "0") is −0.25V; (iv) that the program current is approximately 10 μA; (v) that the resistance corresponding to a logic "0" is approximately 10KΩ; and (vi) that the resistance corresponding to a logic "1" is any value greater than approximately 10 MΩ. It should be readily apparent that alternative parameters and operating voltages and resistances may be selected for the PCRAM cell without departing from the spirit and scope of the invention.

The process begins at process segment 500. At segment 502, sense amplifier 102 sees the two lines D and D*, where both D and D* are respective column lines 108, 106 from different memory arrays 100, 165. For purposes of this description, we will assume Vdd is approximately 2.5V. The cell plate 118 is tied to a predetermined voltage (e.g., Vdd/2, or approximately 1.25V) which is either a condition which is present whenever the memory is active, or one which can be switched to by memory operation. In this illustrated embodiment, the Vdd/2 voltage is turned on at processing segment 506. At segment 508, both lines D, D* 108, 106 are precharged to a predetermined voltage (e.g., Vdd= approximately 2.5V) via precharge circuit 175 and then equilibrated by equilibrate circuit 176.

A selected rowline 122 is fired at segment 510 by applying a predetermined voltage from a rowline decoder to that rowline 122. In this example, the predetermined voltage has been selected to be approximately 2.25V as will be described herein. In order to read the contents of the memory cell 120, or more specifically, in order to read the resistance of the programmable conductor memory element 116 of the memory cell 120, a voltage of approximately 0.2V must be present across the element 116. This means that a voltage of approximately 2.25V must be applied to the rowline 122. A voltage of approximately 2.25V applied to rowline 122 turns on transistor 114. Since the threshold voltage of transistor 114 is approximately 0.8V, then a voltage of approximately 1.45V is present at point A while a voltage of approximately 1.25V is present at the cell plate 118 for a difference of approximately 0.2V, the required read voltage, as indicated at segment 512 of FIG. 5.

It should be mentioned that when access transistor 114 is conducting, the voltage of the digit line D 108 is actually increased by approximately 0.1V (up to approximately 2.6V) due to a parasitic capacitance (e.g., 138 of FIG. 1) inherent between the column line 108 and the rowline 122 of the memory cell. This results in approximately a 0.1V difference between digit line D, the column line 108 associated with the cell being read 120, and D* 106, the reference digit line. The parasitic capacitance 138 may be varied as a function of the construction of the memory cell or an additional capacitance in the form of a fabricated capacitor can also be provided which is switched in circuit and connected with digit line D 108 during a read operation; therefore, in accordance with an exemplary embodiment of the invention, the amount of voltage increase when the rowline 122 is fired can be controlled by the memory architecture. The increase in the voltage at D 108 is described at segment 514.

There are other ways to increase the voltage difference between D and D*, as seen by the sense amplifier 102. For instance, a dummy row line 124 could be employed in the memory array that is not of interest (e.g., 165) such that the dummy rowline 124 is always on and precharged to Vdd (approximately 2.5V). Then, when the desired rowline 122 is fired, and the desired digit line D 108 is raised to approximately 2.6V, due to the parasitic capacitance 138, the dummy rowline 124 is turned off and, as a result, the voltage at digit complement line D* 106 drops to approximately 2.4V due to the parasitic capacitance 138 between the dummy rowline 124 and column line 106. The end result is that D 108 and D* 106 differ by at least approximately 0.2V when D 108 begins to discharge as described below.

Still referring to FIG. 5, at segment 516, the digit line of interest D 108 begins to discharge from approximately 2.6V through the resistance of the programmable conductor memory element down to approximately 1.25V, the cell plate 118 voltage. The longer the discharge operation takes, the greater the resistance level of the programmable conductor memory element 116. A predetermined time (e.g., 15–30 ns) after the selected rowline 122 is fired, at segment 510, the N-sense amplifier 350 is enabled, via control signal Fire N, at segment 518 which compares the voltage on the D 108 and D* 106 lines. At segment 520, a determination is made as to whether the programmable conductor element 116 has a low or high resistance level.

For example, at segment 522, a determination is made as to whether the initial voltage on D 108 has discharged below the voltage on D* 106 in the predetermined timeframe (e.g., 15–30 ns). Referring back to FIG. 3, the voltage values at D* 106 and D 108 are respectively fed to gates of transistors 305 and 300. If at the predetermined time $t_2$, the voltage at the digit line D 108 is higher than the voltage at the digit complement line D* 106, then D* 106 is grounded and D remains floating and considered as having a high resistance level (e.g., logic HIGH) at segment 524.

It should be noted that rowline 122 may be turned off after the access transistor 114 is turned on. Doing so, however, will present the programmable conductor memory element 116 from being rewritten. This may be desired when a logic HIGH was read since a re-write may not be desired after each read operation of a logic HIGH as this is the normal state of the programmable conductor memory element 116 and repeated unnecessary re-writing may result in damage to the element 116 over time.

Still referring to segment 522, if at the predetermined time $t_2$, the voltage at D 108 is lower than that at D* 106, then line D 108 is grounded and D 108 is considered as having a low resistance level (e.g., logic LOW) at segment 526.

At segment 528, P-sense amplifier 360 is enabled, via control signal Fire P, a predetermined time (e.g., 1–5 ns) $t_3$ after the N-sense amplifier 350 is enabled. If a high resistance level was recognized at segment 524 (i.e., D 108 is logic HIGH), then transistor 330 is on and transistor 325 is off and the voltage at line D 108 is boosted to approximately Vdd at segment 530.

If a low resistance level was recognized at segment 524 (i.e., D 108 is logic LOW), then transistor 330 is off and transistor 325 is on and line D* 106 is maintained at approximately Vdd at segment 532.

At segment 534, the rowline 122 voltage is raised to approximately Vdd. If the programmable conductor memory element 116 contained a low resistive state, then, as described above, raising the rowline 122 voltage to approximately Vdd is not necessary to re-write a low resistive state; however, the rowline 122 is nonetheless raised in order to facilitate re-writing a high resistance state. That is, if the programmable conductor memory element 116 contained a high resistive state, then raising the rowline 122 to approximately Vdd sets the voltage at point A to approximately 1.7V, thereby placing a voltage potential difference of approximately 0.45V across the programmable conductor memory element 116 which is sufficient for re-writing.

Figure 6:
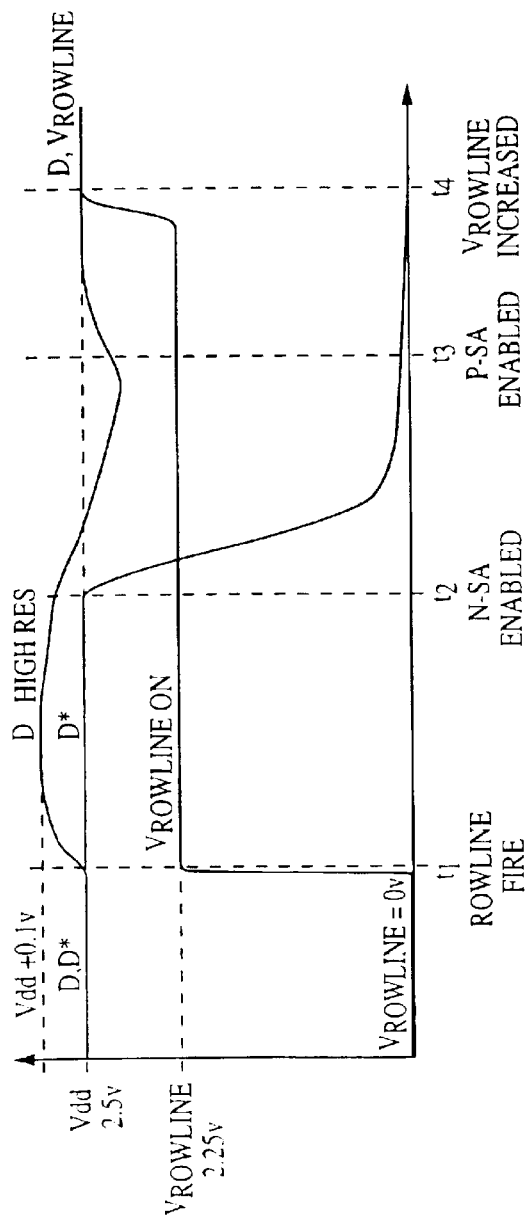
FIG. 6 depicts a timing diagram for a reading of high resistance in a sensed memory cell, in accordance with an exemplary embodiment of the invention.

FIG. 6 depicts a timing diagram showing a process flow for finding a high resistance level, as described in connection with a portion of FIG. 5. For example, initially, both D 108 and D* 106 are precharged to approximately Vdd. At time $t_1$, rowline 122 fires and turns on transistor 114. The voltage at D 108 increases by approximately 0.1V to approximately 2.6V due to the parasitic capacitance 138 between rowline 122 and column line 108. Then, line D 108 is discharged from approximately 2.6V for approximately 15–30 ns while line D* 106 is maintained at approximately Vdd. At time $t_2$, N-sense amplifier 350 is enabled and compares the voltage at line D 108 with that of line D* 106. If the voltage measured at D 108 is greater than that of D* 106, then a high resistance level is recognized, as described in connection with FIG. 5. In addition, line D* 106 is forced to ground (0V) at time $t_2$. At time $t_3$, P-sense amplifier 360 is enabled and line D is boosted to Vdd and read as logic HIGH. At time $t_4$, the rowline 122 voltage is increased from approximately 2.25 to approximately Vdd, thereby enabling the contents of the programmable conductor element 116 to be rewritten.

Figure 7:
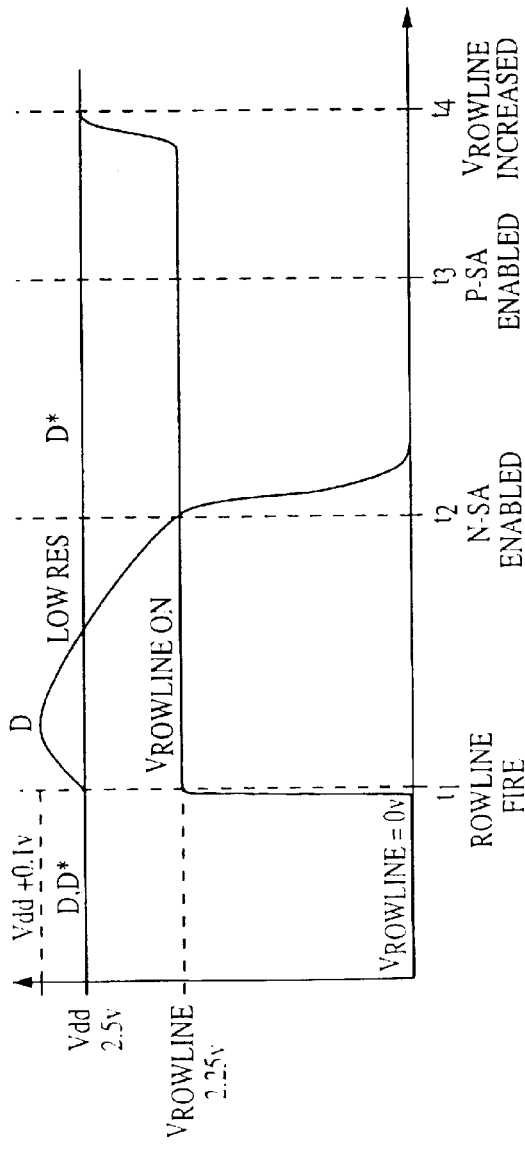
FIG. 7 depicts a timing diagram for a reading of low resistance in a sensed memory cell, in accordance with an exemplary embodiment of the invention.

FIG. 7 depicts a timing diagram showing a process flow for finding a low resistance level, as described in connection with a portion of FIG. 5. For example, initially, both line D 108 and line D* 106 are precharged to approximately Vdd. At time $t_1$, rowline 122 fires and turns on transistor 114. The voltage at D 108 increases by approximately 0.1V to approximately 2.6V due to parasitic capacitance 138. Then, D 108 is discharged from approximately 2.6V for approximately 15–30 ns while D* 106 is maintained at approximately Vdd. At time $t_2$, N-sense amplifier 350 is enabled and compares the voltage at line D 108 with that of line D* 106. If the voltage measured at D 108 is less than that of D* 106, then a low resistance level is recognized, as described in connection with FIG. 5. In addition, line D 108 is forced to ground (0V) at time $t_2$. At time $t_3$, P-sense amplifier 360 is enabled and line D remains at 0V and is read as logic LOW and line D* is maintained at approximately Vdd. At time $t_4$, rowline 122 voltage is increased from approximately 2.25 to approximately Vdd. As described above, although this is not necessary to re-write a low resistance level in the programmable conductor memory element 116, it is done so that other memory cells storing a high resistance level may be rewritten.

Figure 8:
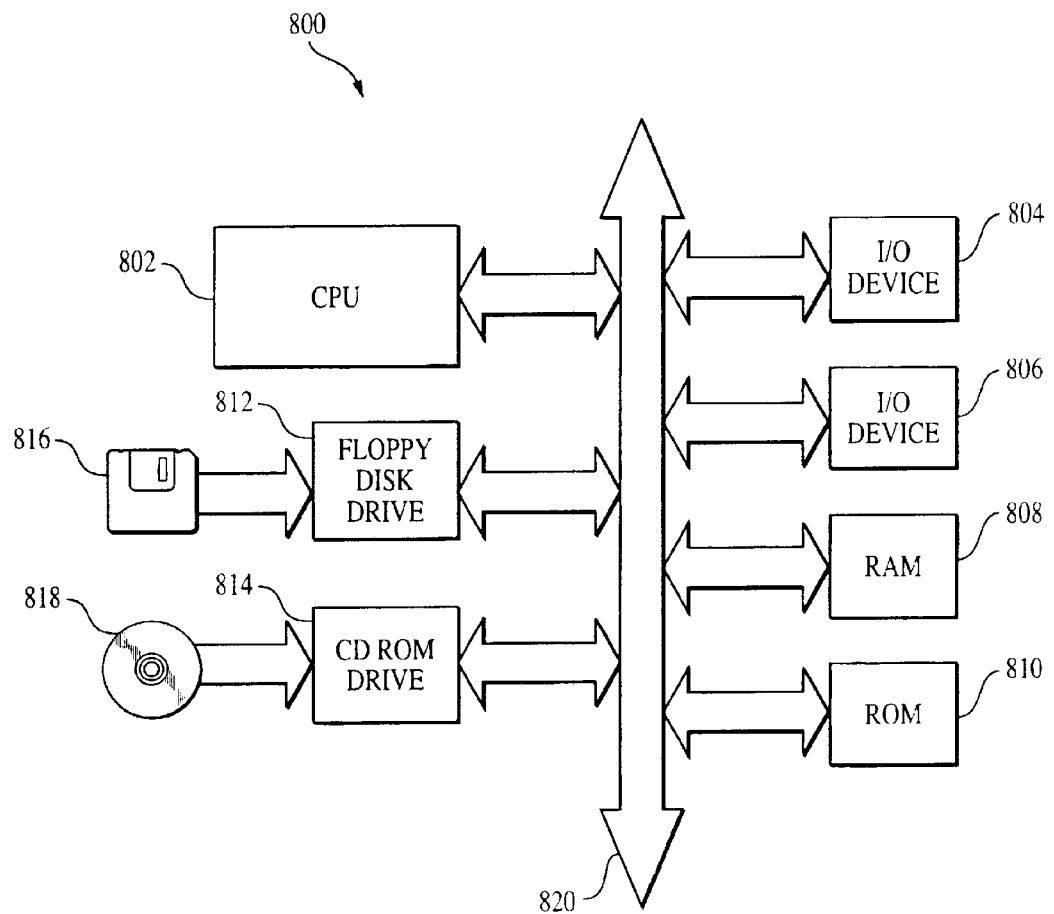
FIG. 8 depicts a block diagram of a processor-based system containing a PCRAM memory, in accordance with an exemplary embodiment of the invention.

FIG. 8 illustrates a block diagram of a processor system 800 containing a PCRAM semiconductor memory as described in connection with FIGS. 1–7. For example, the PCRAM memory arrays 100, 165 described in connection with FIGS. 1–7 may be part of random access memory (RAM) 808 which may be constructed as a plug-in module containing one or more memory devices having the PCRAM structure described above. The processor-based system 800 may be a computer system or any other processor system.

The system 800 includes a central processing unit (CPU) 802, e.g., a microprocessor, that communicates with floppy disk drive 812, CD ROM drive 814, and RAM 808 over a bus 820. It must be noted that the bus 820 may be a series of buses and bridges commonly used in a processor-based system, but for convenience purposes only, the bus 820 has been illustrated as a single bus. An input/output (I/O) device (e.g., monitor) 804, 806 may also be connected to the bus 820, but are not required in order to practice the invention. The processor-based system 800 also includes a read-only memory (ROM) 800 which may also be used to store a software program.

Although the FIG. 8 block diagram depicts only one CPU 802, the FIG. 8 system could also be configured as a parallel processor machine for performing parallel processing. As known in the art, parallel processor machines can be classified as single instruction/multiple data (SIMD), meaning all processors execute the same instructions at the same time, or multiple instruction/multiple data (MIMD), meaning each processor executes different instructions.

The present invention provides a PCRAM cell 120 and a method for reading the contents of the memory cell 120. The memory cell 120 consists of a programmable conductor memory element 116 in series with a first terminal of an access transistor 114. The other side of the programmable conductor memory element 116 is coupled to a cell plate 118 that may extend across a plurality of programmable conductor memory elements 116. A second terminal of the access transistor 114 is coupled to a column line 108, which can be the desired digit line (D). The gate of the transistor 114 is coupled to the rowline 122 of the memory cell 120. A first predetermined voltage potential (e.g., Vdd) is applied to digit line D 108 and a reference digit line D* 106 of an adjacent memory array 165. A second predetermined voltage potential is applied to the cell plate 118. When the rowline 122 for a desired memory cell 120 is fired with a third predetermined voltage potential (e.g., approximately 2.25V), the access transistor 114 is turned on and conducts and digit line D 108 discharges for a predetermined time period (e.g., 15–30 ns) at which time, line D 108 and line D* 106 are compared with each other, with sense amplifier 102, in order to determine whether the programmable conductor element 116 contains a high or low resistance level. The memory cell 120 being read is then prepared for a next cycle by precharging both line D 108 and line D* 106, as well as the rowline 122 voltage, up to approximately Vdd so that the high resistance level may be rewritten to the memory cell 120 if the memory cell did in fact have a high resistance level. If the memory cell 120 had a low resistance level, then raising the voltage potentials of lines D 108 and D* 106 and the rowline 122 will have no effect on the resistance of the memory cell 120.

While the invention has been described in detail in connection with preferred embodiments known at the time, it should be readily understood that the invention is not limited to the disclosed embodiments. Rather, the invention can be modified to incorporate any number of variations, alterations, substitutions or equivalent arrangements not heretofore described, but which are commensurate with the spirit and scope of the invention. For example, although the invention has been described in connection with specific voltage levels, it should be readily apparent that voltage levels very different than those described herein can be used to achieve the same results. In addition, although the invention has been described in connection with n-type and p-type CMOS transistors, it should be readily apparent that complementary CMOS transistors can be used instead.

Furthermore, although the invention has been described in connection with a specific polarity for the memory cell 120, that polarity may be reversed resulting in different voltage levels being applied to the transistor 114, cell plate 118, digit line D 108 and digit complement line D* 106. Accordingly, the invention is not limited by the foregoing description or drawings, but is only limited by the scope of the appended claims.

What is claimed as new and desired to be protected by Letters Patent of the United States is:

1. A method of sensing a stored value of a programmable conductor random access memory element, the method comprising:

precharging a digit line and a digit complement line to a predetermined voltage value;

activating an access transistor coupled between said element and said digit line to apply a read voltage to said element; and comparing the voltage on said digit line with a voltage on said digit complement line to determine a resistance level, and thereby, a logical state of said element.

2. The method of claim 1, wherein said act of precharging comprises precharging said digit line and said digit complement line to approximately Vdd.

3. The method of claim 1, wherein said act of precharging comprises receiving a precharge control signal at a precharge circuit and coupling said digit line and said digit complement line to approximately Vdd.

4. The method of claim 1, wherein said act of precharging further comprises equilibrating said voltage on said digit line and said voltage on said digit complement line.

5. The method of claim 1, wherein said act of activating comprises firing a rowline coupled to a gate of said access transistor.

6. The method of claim 1 further comprising discharging said voltage on said digit line for a predetermined period of time before said act of comparing.

7. The method of claim 6, wherein said act of discharging further comprises discharging said voltage on said digit line from a voltage value approximately equal to said predetermined voltage plus an additional voltage.

8. The method of claim 7, wherein said additional voltage is due to parasitic capacitance between said digit line and a rowline coupled to said access transistor.

9. The method of claim 1 further comprising reading a low resistance level at said element.

10. The method of claim 1 further comprising rewriting said low resistance level into said element.

11. The method of claim 1 further comprising reading a high resistance level at said element.

12. The method of claim 1 further comprising applying a voltage to a second terminal of said memory element, said voltage being between 0 v and said predetermined voltage.

13. The method of claim 12, wherein said act of applying comprises applying said voltage to a cell plate ties to said second terminal of said memory element.

14. A method for reading a semiconductor memory cell, the method comprising:

setting a voltage of a cell plate of said cell, to which a first portion of a resistive element of said cell is coupled, to a first predetermined voltage;

charging a first terminal of an access transistor of said cell and a reference conductor to a second predetermined voltage, wherein said first terminal is coupled to a column line of said cell, wherein a second terminal of said transistor is coupled to a second portion of said resistive element, and wherein said first terminal and said reference conductor are coupled to respective inputs of a comparator;

charging a gate of said access transistor to a third predetermined voltage in order to read said cell, wherein said gate is coupled to a rowline of said cell;

discharging said first terminal from said second predetermined voltage through the resistive element; and comparing a voltage at said first terminal with said second predetermined voltage a predetermined period of time after said act of discharging begins in order to determine a logical state of said cell.

15. The method of claim 14, wherein said second predetermined voltage is greater than said first predetermined voltage.

16. The method of claim 14, wherein said act of discharging comprises discharging said first terminal from a fourth predetermined voltage that is slightly different from said second predetermined voltage, said fourth predetermined voltage resulting from a parasitic capacitance associated with said column line.

17. The method of claim 14 further comprising changing said third predetermined voltage to a level sufficient to rewrite said resistance level to said memory cell after said memory cell has been read.

18. The method of claim 17, wherein said act of changing comprises increasing said third predetermined voltage to said second predetermined voltage.

19. The method of claim 18, wherein said act of increasing comprises increasing said third predetermined voltage level to approximately Vdd.

20. The method of claim 17 further comprising rewriting said high resistance level to said memory cell.

21. The method of claim 14, wherein said act of setting comprises setting said voltage of said cell plate to approximately Vdd.

22. The method of claim 21, wherein said act of setting comprises setting said voltage of said cell plate to approximately Vdd/2.

23. The method of claim 14, wherein said act of charging a first terminal of a transistor comprises charging said first terminal and said reference conductor to approximately Vdd.

24. The method of claim 14, wherein said act of charging a gate comprises charging said gate to a value sufficient for reading said resistive element, but less than a value that would enable said cell to be programmed.

25. The method of claim 24, wherein said act of charging said gate comprises charging said gate to a voltage level between said first and second predetermined voltages.

26. The method of claim 16, wherein said act of discharging said first terminal comprises discharging said first terminal from approximately Vdd plus an additional voltage.

27. The method of claim 26, wherein said act of discharging said first terminal comprises discharging said first terminal from approximately Vdd plus approximately 0.1V.

28. The method of claim 14, wherein said act of comparing comprises comparing said voltage at said first terminal with said second predetermined voltage approximately 15–30 ns after said act of discharging has begun.

29. The method of claim 14 further comprising determining said memory cell has a logic HIGH state.

30. The method of claim 14 further comprising determining said memory cell has a logic LOW state.

31. A method for sensing a stored value of a programmable conductor random assess memory cell, the method comprising:

precharging a digit line coupled to a first terminal of an access transistor of said cell to a first predetermined voltage;

charging a cell plate of said cell to a second predetermined voltage, said second predetermined voltage being a value between 0V and said first predetermined voltage; and applying a third predetermined voltage to a rowline coupled to a gate of said access transistor such that a resulting voltage across said programmable conductor memory cell is sufficient to read a logical state of said cell, but insufficient to program said cell.

32. A method for sensing a stored value of a programmable conductor random access memory cell, the method comprising:

precharging a digit line to a reference voltage value, said digit line being coupled to a first terminal of an access transistor of said cell;

charging a cell plate of said cell to a first predetermined voltage, said first predetermined voltage being a value between 0V and said reference voltage value;

firing a rowline of said memory cell by applying a second predetermined voltage, said second predetermined voltage being sufficient to read said memory cell, but insufficient to program said memory cell; and comparing a voltage read at said digit line with said reference voltage in order to determine a logical state of said memory cell.

33. A semiconductor memory structure comprising:

a digit line and a digit complement line;

a circuit for precharging said digit line and said digit complement line to a predetermined voltage value prior to a read operation;

an access transistor for coupling a programmable conductor memory element to said digit line during a read operation; and a sense amplifier for comparing voltages on said digit line and said digit complement line during said read operation to determine a resistance level, and thereby, a logical state of said memory element.

34. The structure of claim 33, wherein said predetermined voltage is approximately Vdd.

35. The structure of claim 33, wherein said programmable conductor memory element comprises a chalcogenide glass having first and second electrodes.

36. The structure of claim 35, wherein said chalcogenide glass has a Ge, Se and Ag composition.

37. The structure of claim 33 further comprising a variable parasitic capacitance between said digit line and a rowline of said memory structure, said variable parasitic capacitance causing said digit line to be charged to a voltage level higher than said predetermined voltage during said read operation.

38. The structure of claim 33, wherein said digit complement line is associated with a memory array different from a memory array with which said memory cell is associated.

39. The structure of claim 33 further comprising an equilibrate circuit the equilibrating said digit line and said digit complement line to said predetermined voltage.

40. A semiconductor memory comprising:

a programmable conductor memory element;

a column line;

a rowline;

a conductor for applying a first voltage to a first terminal of said programmable conductor memory element;

a transistor for selectively coupling said column line to another terminal of said programmable conductor memory element in response to a gate voltage applied to said rowline;

a sense amplifier coupled to said column line and a reference conductor; and a precharge circuit for precharging said column line and reference conductor to a predetermined voltage prior to application of a gate voltage to said rowline, said sense amplifier comparing a voltage on said column line and reference line to determine a resistance value of said programmable conductor memory element after said gate voltage is applied to said rowline.

41. The memory of claim 40, wherein said first voltage is a voltage between 0V and approximately Vdd.

42. The memory of claim 40, wherein said programmable conductor memory element comprises a chalcogenide glass having first and second electrodes.

43. The memory of claim 42, wherein said chalcogenide glass has a Ge, Se and Ag composition.

44. The memory of claim 40, wherein said gate voltage is sufficient to read said memory element but insufficient to program said memory element.

45. The memory of claim 40 further comprising a variable parasitic capacitance associated with said column line, said variable parasitic capacitance causing said column line to be charged to a voltage level higher than said predetermined voltage supplied by said precharge circuit in response to said gate voltage being applied to said rowline.

46. The memory of claim 45, wherein said variable parasitic capacitance causes said column line to be charged to approximately 0.1V higher than said predetermined voltage supplied by said precharge circuit.

47. The memory of claim 40, wherein said sense amplifier comprises:

an N-sense amplifier; and a P-sense amplifier coupled to said N-sense amplifier, wherein said N-sense amplifier and said P-sense amplifier compare voltage values at said column line and said reference conductor.

48. The memory of claim 40, wherein said reference conductor is associated with a memory array different from a memory array with which said memory element is associated.

49. The memory of claim 40 further comprising a dummy rowline associated with said reference conductor, said dummy rowline normally being fired to a dummy rowline voltage and when said gate voltage is applied to said rowline, said dummy rowline is deactivated such that said predetermined voltage at said reference conductor decreases due to parasitic capacitance at a column line associated with said dummy rowline.

50. A processor system, comprising:

a processor; and a semiconductor memory structure coupled to said processor, said semiconductor memory structure comprising:

a digit line and a digit complement line;

a circuit for precharging said digit line and said digit complement line to a predetermined voltage value prior to a read operation;

an access transistor for coupling a programmable conductor memory element to said digit line during a read operation; and a sense amplifier for comparing voltages on said digit line and said digit complement line during said read operation to determine a resistance level, and thereby, a logical state of said memory element.

51. The system of claim 50, wherein said predetermined voltage is approximately Vdd.

52. The system of claim 50, wherein said programmable conductor memory element comprises a chalcogenide glass having first and second electrodes.

53. The system of claim 52, wherein said chalcogenide glass has a Ge, Se and Ag composition.

54. The system of claim 50 further comprising a variable parasitic capacitance between said digit line and a rowline of said memory cell, said variable parasitic capacitance causing said digit line to be charged to a voltage level higher than said predetermined voltage during said read operation.

55. The system of claim 50 wherein said digit complement line is associated with a memory array different from a memory array with which said memory cell is associated.

56. A processor system comprising:

a processor; and a semiconductor memory coupled to said processor, said semiconductor memory comprising:

a programmable conductor memory element;

a column line;

a rowline;

a conductor for applying a first voltage to a first terminal of said programmable conductor memory element;

a transistor for selectively coupling said column line to another terminal of said programmable conductor memory element in response to a gate voltage applied to said rowline;

a sense amplifier coupled to said column line and a reference conductor; and a precharge circuit for precharging said column line and reference conductor to a predetermined voltage prior to application of a gate voltage to said rowline, said sense amplifier comparing a voltage on said column line and reference line to determine a resistance value of said programmable conductor memory element after said gate voltage is applied to said rowline.

57. A method for reading a semiconductor memory cell, the method comprising:

precharging a digit line and a digit complement line to a predetermined voltage value;

activating an access transistor coupled between a programmable conductor memory element and said digit line to apply a read voltage to said programmable conductor memory element; and comparing the voltage on said digit line with a voltage on said digit complement line to determine a resistance level, and thereby, a logical state of said programmable conductor memory element.

* * * * *